US012125921B2

(12) United States Patent
Wu et al.

(10) Patent No.: US 12,125,921 B2
(45) Date of Patent: *Oct. 22, 2024

(54) SEMICONDUCTING METAL OXIDE TRANSISTORS HAVING A PATTERNED GATE AND METHODS FOR FORMING THE SAME

(71) Applicant: Taiwan Semiconductor Manufacturing Company Limited, Hsinchu (TW)

(72) Inventors: Yong-Jie Wu, Tainan (TW); Hui-Hsien Wei, Taoyuan (TW); Yen-Chung Ho, Hsinchu (TW); Mauricio Manfrini, Hsinchu (TW); Chia-Jung Yu, Hsinchu (TW); Chung-Te Lin, Taiwan (TW); Pin-Cheng Hsu, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/354,681

(22) Filed: Jul. 19, 2023

(65) Prior Publication Data

US 2023/0361221 A1 Nov. 9, 2023

Related U.S. Application Data

(63) Continuation of application No. 17/216,747, filed on Mar. 30, 2021, now Pat. No. 11,757,047.
(Continued)

(51) Int. Cl.
*H01L 29/786* (2006.01)
*H01L 29/40* (2006.01)
(Continued)

(52) U.S. Cl.
CPC ...... *H01L 29/78696* (2013.01); *H01L 29/401* (2013.01); *H01L 29/41733* (2013.01);
(Continued)

(58) Field of Classification Search
CPC ............. H01L 29/78696; H01L 29/401; H01L 29/41733; H01L 29/41775;
(Continued)

(56) References Cited

U.S. PATENT DOCUMENTS 11,757,047 B2 * 9/2023 Wu .................. H01L 29/42364
257/288
2015/0021596 A1 1/2015 Yamazaki et al.
(Continued)

FOREIGN PATENT DOCUMENTS

JP 2008270313 A 11/2008
KR 20090016452 2/2009
(Continued)

OTHER PUBLICATIONS

Chinese Patent and Trademark Office, CN Application No. 202110604364.0, 1st Office Action, mailed Jan. 3, 2024, 10 pages.
(Continued)

*Primary Examiner* — Tong-Ho Kim
(74) *Attorney, Agent, or Firm* — The Marbury Law Group, PLLC

(57) ABSTRACT

A semiconductor device includes a first dielectric layer, a gate electrode embedded within the first dielectric layer, a layer stack including a gate dielectric layer, a channel layer including a semiconducting metal oxide material, and a second dielectric layer, and a source electrode and a drain electrode embedded in the second dielectric layer and contacting a respective portion of a top surface of the channel layer. A combination of the gate electrode, the gate dielectric layer, the channel layer, the source electrode, and the drain
(Continued)

electrode forms a transistor. The total length of the periphery of a bottom surface of the channel layer that overlies the gate electrode is equal to the width of the gate electrode or twice the width of the gate electrode, and resputtering of the gate electrode material on sidewalls of the channel layer is minimized.

20 Claims, 20 Drawing Sheets

Related U.S. Application Data

(60) Provisional application No. 63/031,720, filed on May 29, 2020.

(51) Int. Cl.
*H01L 29/417* (2006.01)
*H01L 29/423* (2006.01)
*H01L 29/66* (2006.01)

(52) U.S. Cl.
CPC .. *H01L 29/41775* (2013.01); *H01L 29/42364* (2013.01); *H01L 29/42384* (2013.01); *H01L 29/66742* (2013.01); *H01L 29/78618* (2013.01); *H01L 29/7869* (2013.01)

(58) Field of Classification Search
CPC ......... H01L 29/42364; H01L 29/42384; H01L 29/66742; H01L 29/78618; H01L 29/7869; H01L 27/1225; H01L 29/66969; H01L 29/78648; H01L 29/78609; H01L 29/0607; H01L 29/1033; H01L 29/42356; H01L 21/76829; H01L 21/823475; H01L 29/24; H01L 29/4908

USPC .......................................................... 257/288
See application file for complete search history.

(56) References Cited

U.S. PATENT DOCUMENTS

| | | |
|---|---|---|
| 2016/0204269 A1 | 7/2016 | Sakata et al. |
| 2017/0141232 A1 | 5/2017 | Hsu et al. |
| 2017/0236842 A1 | 8/2017 | Matsuda et al. |
| 2019/0109199 A1 | 4/2019 | Yao et al. |
| 2019/0157430 A1 | 5/2019 | Jiang |
| 2019/0312149 A1 | 10/2019 | Endo et al. |
| 2020/0091274 A1 | 3/2020 | Sharma et al. |

FOREIGN PATENT DOCUMENTS

| | | |
|---|---|---|
| KR | 20120071540 | 7/2012 |
| KR | 20180025942 A | 3/2018 |
| TW | 201709323 A | 3/2017 |
| WO | 2019/132895 A1 | 7/2019 |

OTHER PUBLICATIONS

1st Examination Office Action received from the German (Federal Republic of Germany) Patent Office in related Application No. 102021108764.3, issued Mar. 2, 2023, 12 pages.
Korean Patent and Trademark Office, KR Application No. 10-2021-0069124 Office Action, mailed Jul. 29, 2022, 6 pages.
Korean Patent and Trademark Office, KR Application No. 10-2021-0069124; Final Office Action, mailed Mar. 21, 2023, 8 pages.
Taiwan Patent and Trademark Office, Application No. 110118006 Office Action dated Nov. 19, 2021, 8 pages.

\* cited by examiner

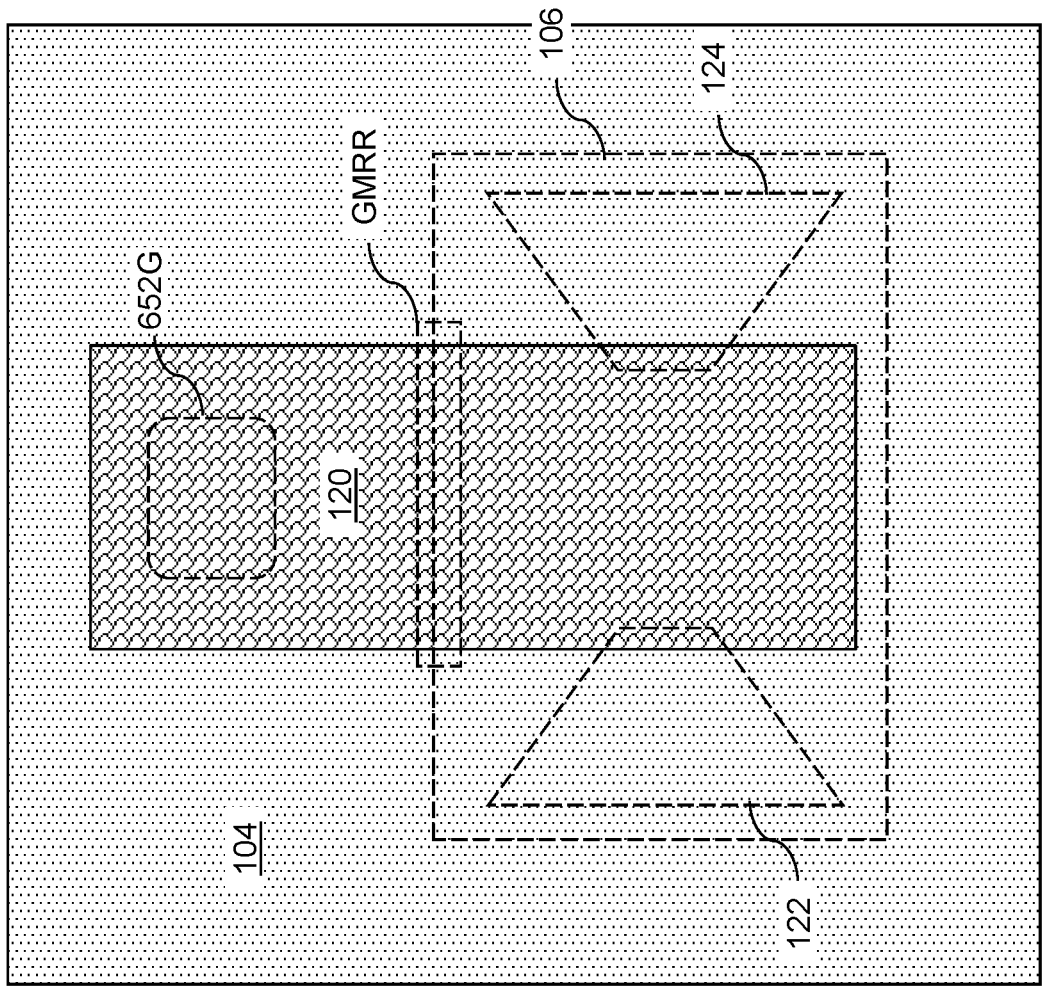
FIG. 2B

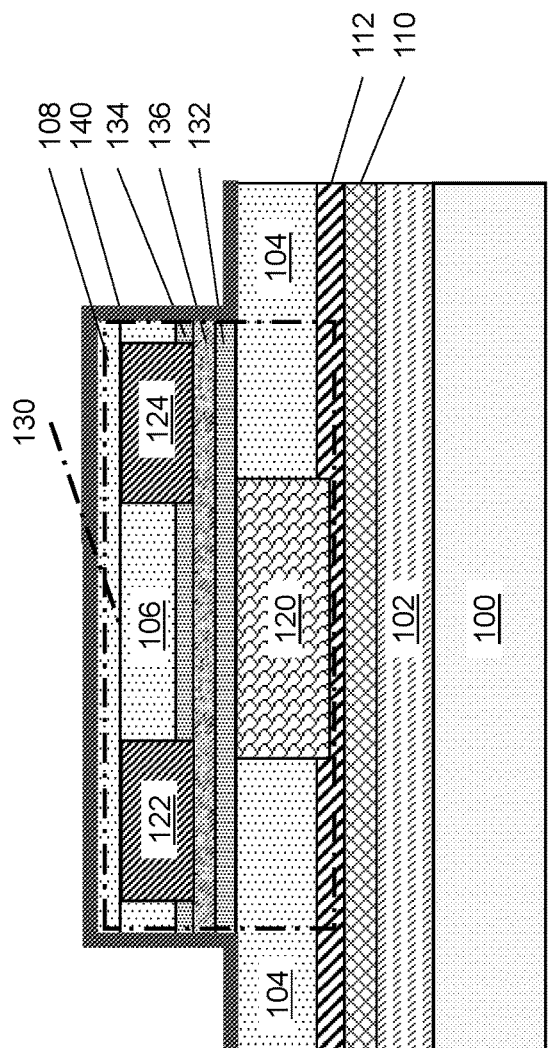
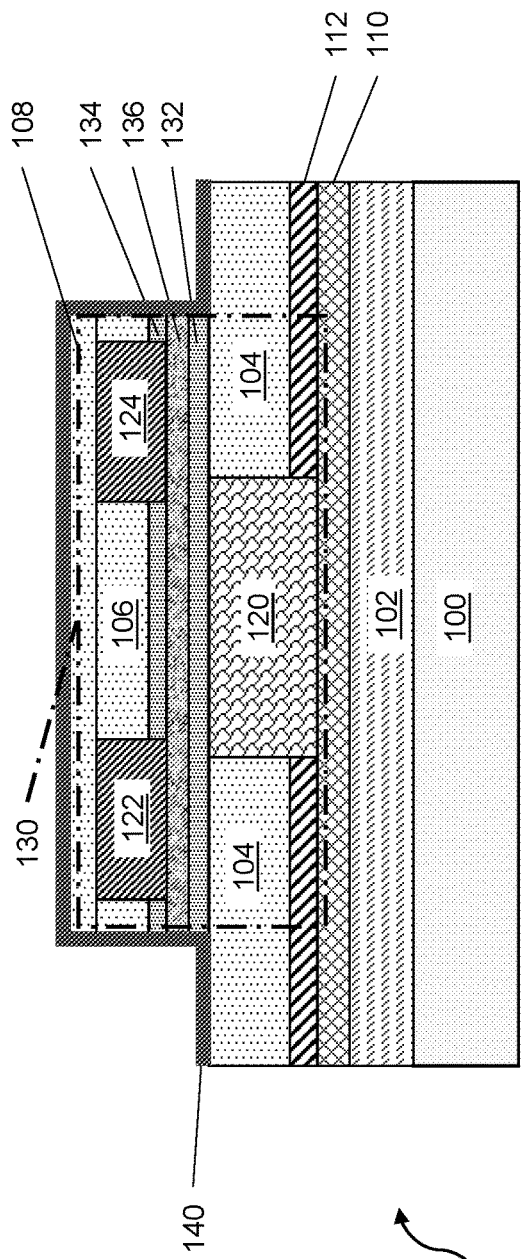

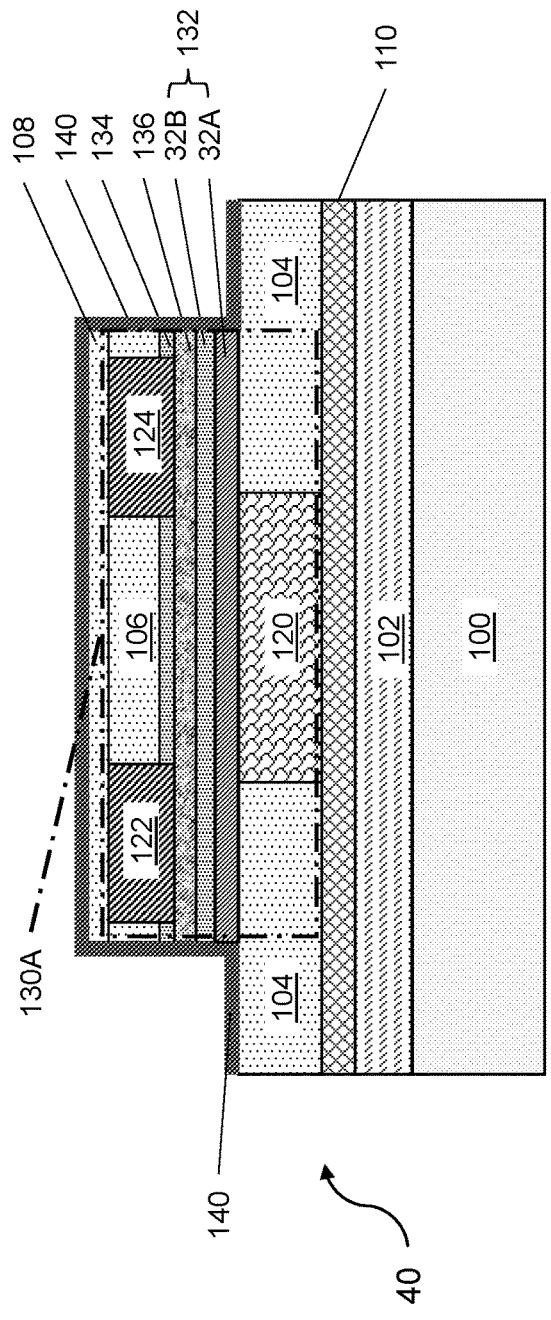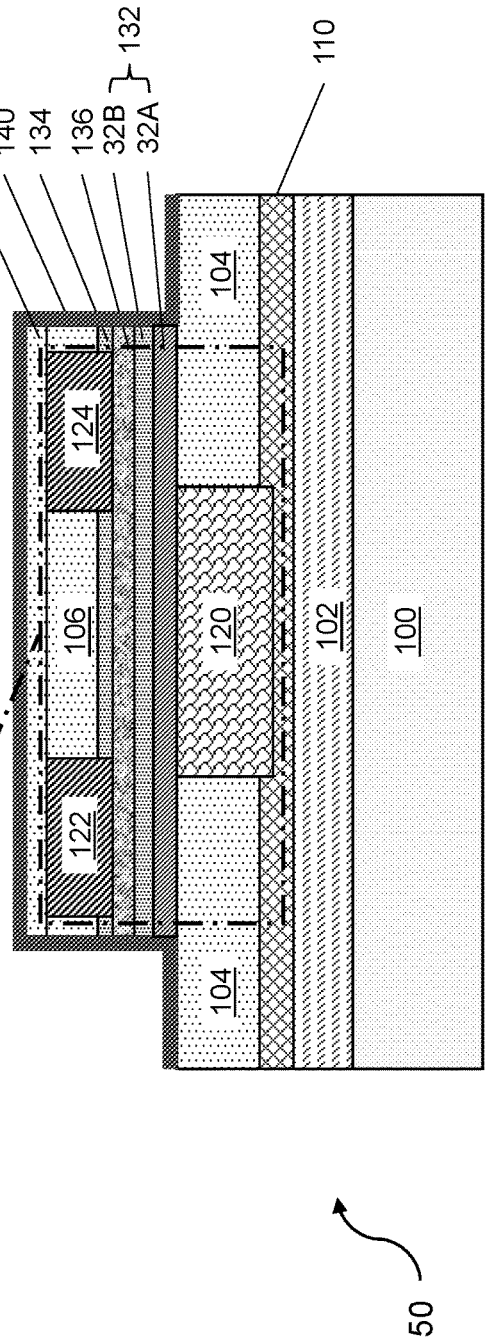

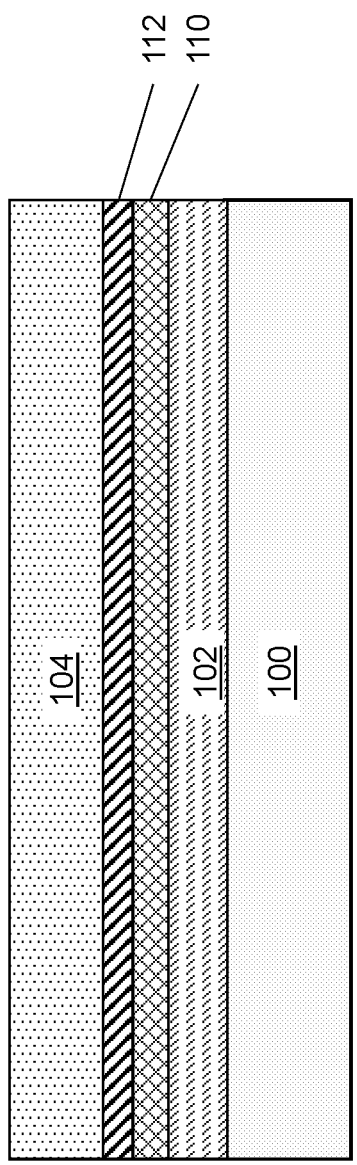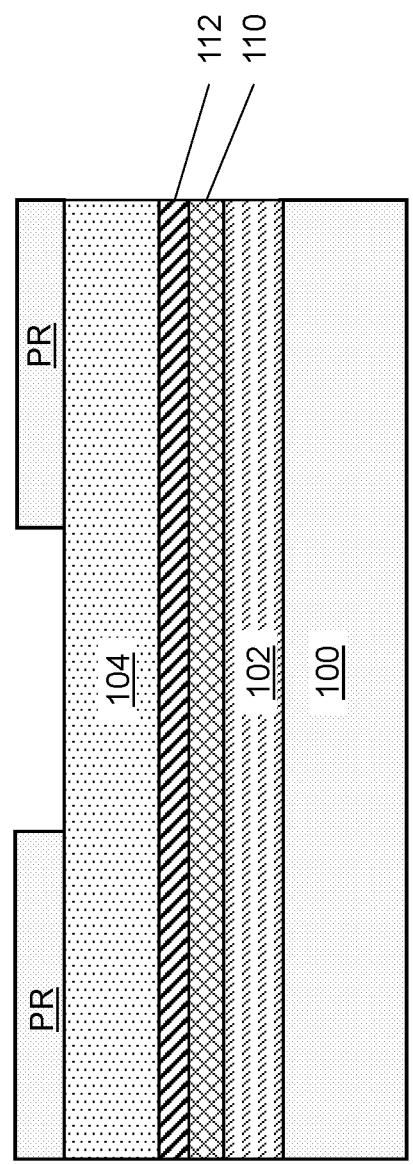

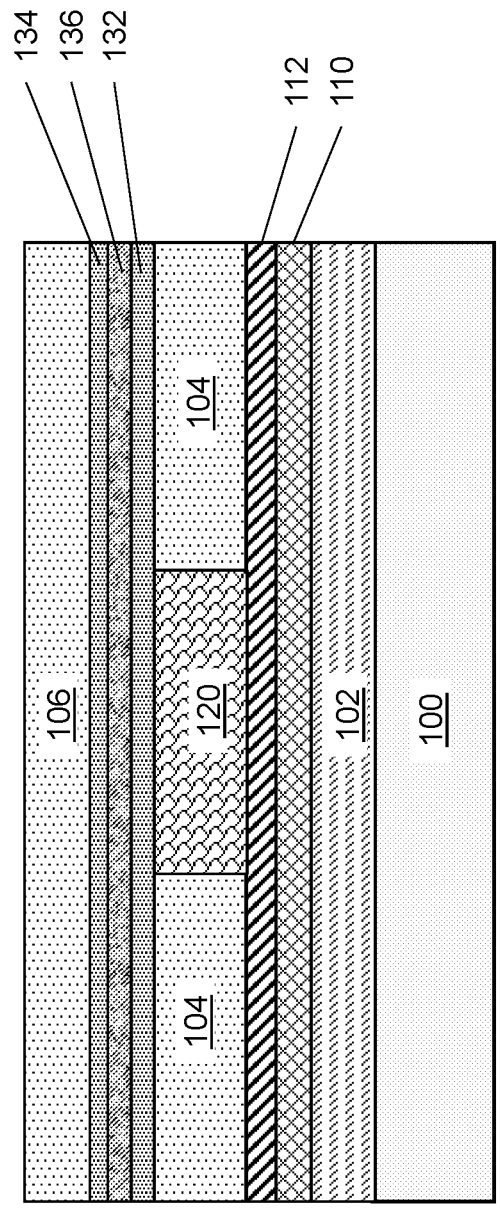
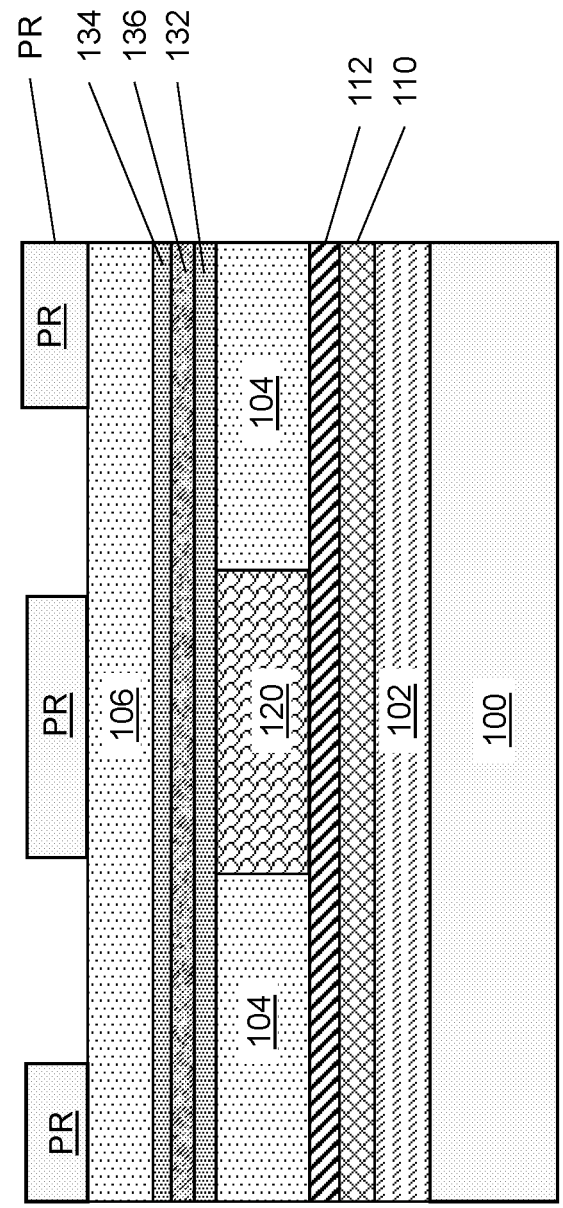
FIG. 8E
FIG. 8F

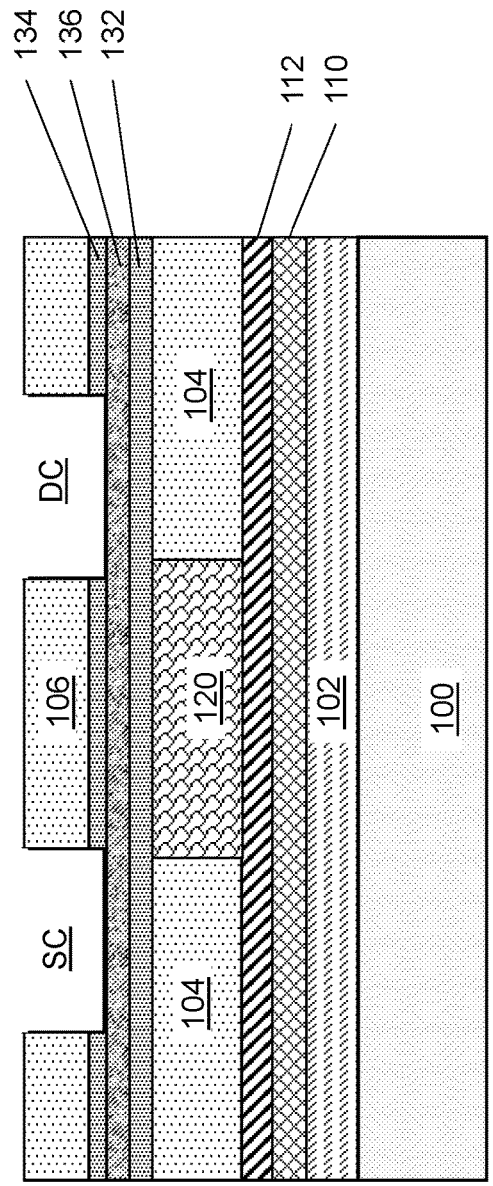
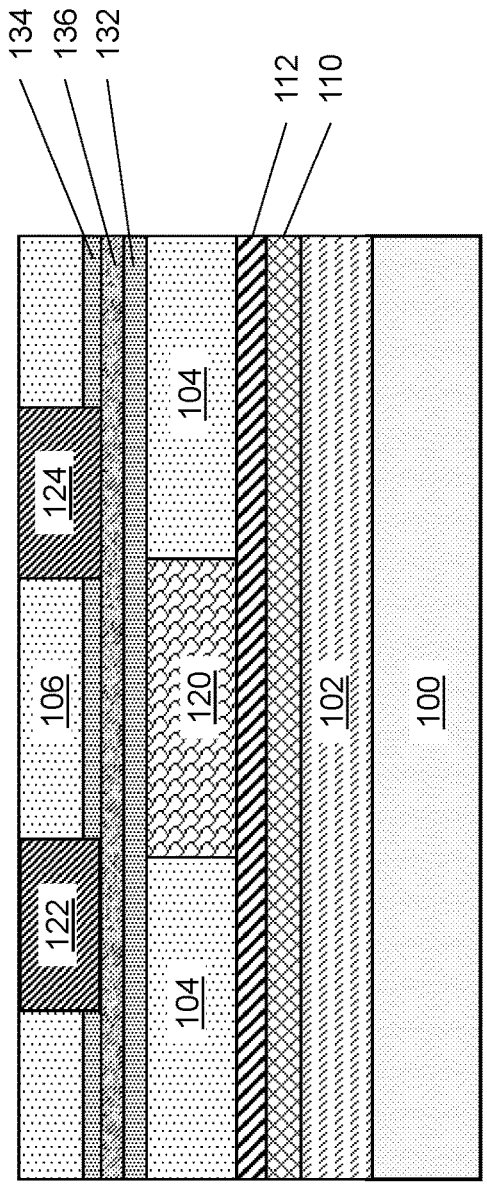
FIG. 8G
FIG. 8H

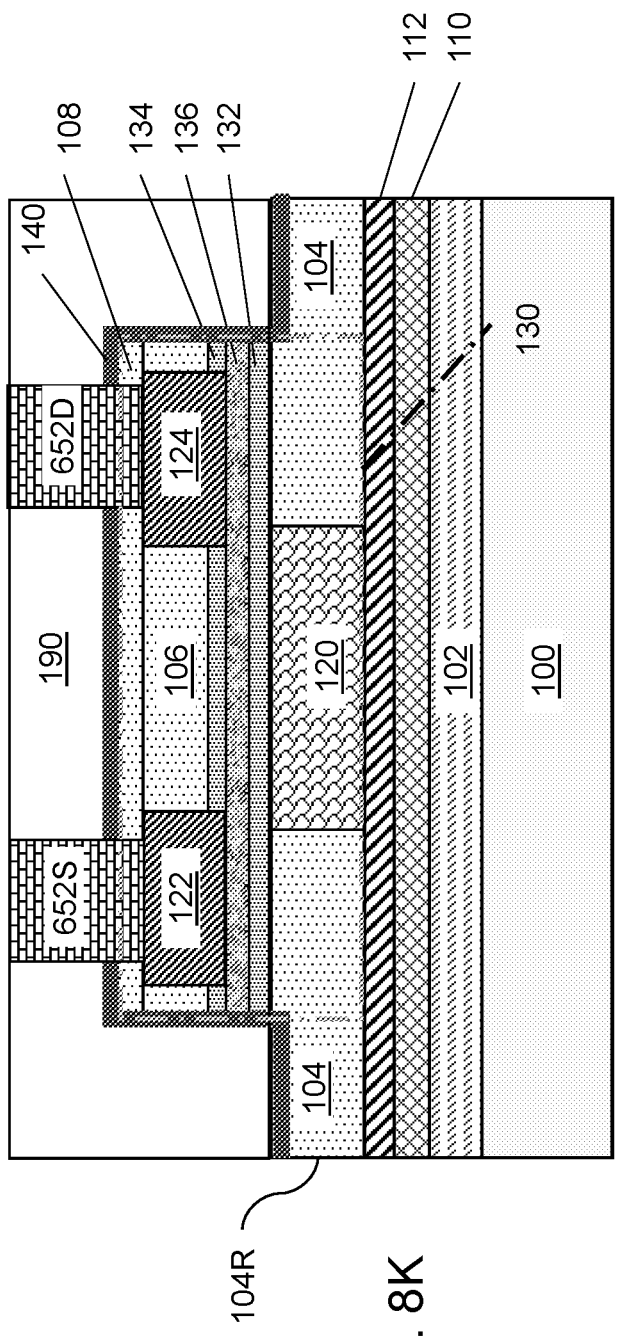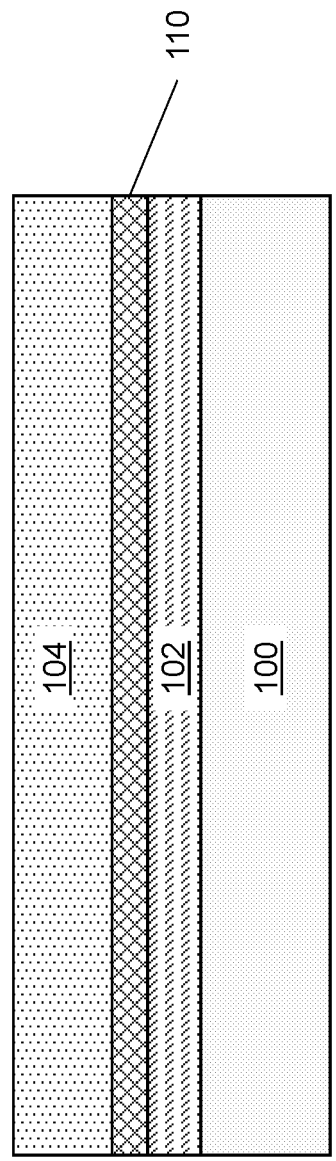

SEMICONDUCTING METAL OXIDE TRANSISTORS HAVING A PATTERNED GATE AND METHODS FOR FORMING THE SAME

RELATED APPLICATIONS

This application is a continuation application of U.S. patent application Ser. No. 17/216,747 entitled "Semiconducting Metal Oxide Transistors Having a Patterned Gate and Methods for Forming the Same," filed on Mar. 30, 2021, which claims priority to U.S. Provisional Patent Application No. 63/031,720 entitled "IGZO TFT Device with Pattern Gate" filed on May 29, 2020, the entire contents of both of which are hereby incorporated by reference for all purposes.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to pattern circuit components and elements thereon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a horizontal cross-sectional view along the horizontal plane X-X' of FIG. 2A in embodiments in which the TFT semiconductor device 10 is formed as a stand-alone TFT semiconductor device that does not share a gate electrode 120 with another TFT semiconductor device. Contours of selected overlying structures are illustrated in dotted lines.

FIG. 3 is a cross-sectional view of a semiconductor device 20, according to various embodiments of the present disclosure.

FIG. 4 is a cross-sectional view of a semiconductor device 30, according to various embodiments of the present disclosure.

FIG. 5 is a cross-sectional view of a semiconductor device 40, according to various embodiments of the present disclosure.

FIG. 6 is a cross-sectional view of a semiconductor device 50, according to various embodiments of the present disclosure.

FIGS. 8A-8K are cross-sectional views illustrating a method of forming the semiconductor device 10 of FIGS. 2A-2D, according to various embodiments of the present disclosure.

FIGS. 9A-9K are cross-sectional views illustrating a method of forming the semiconductor device 40 of FIG. 5, according to various embodiments of the present disclosure.

DETAILED DESCRIPTION

Figure 1:
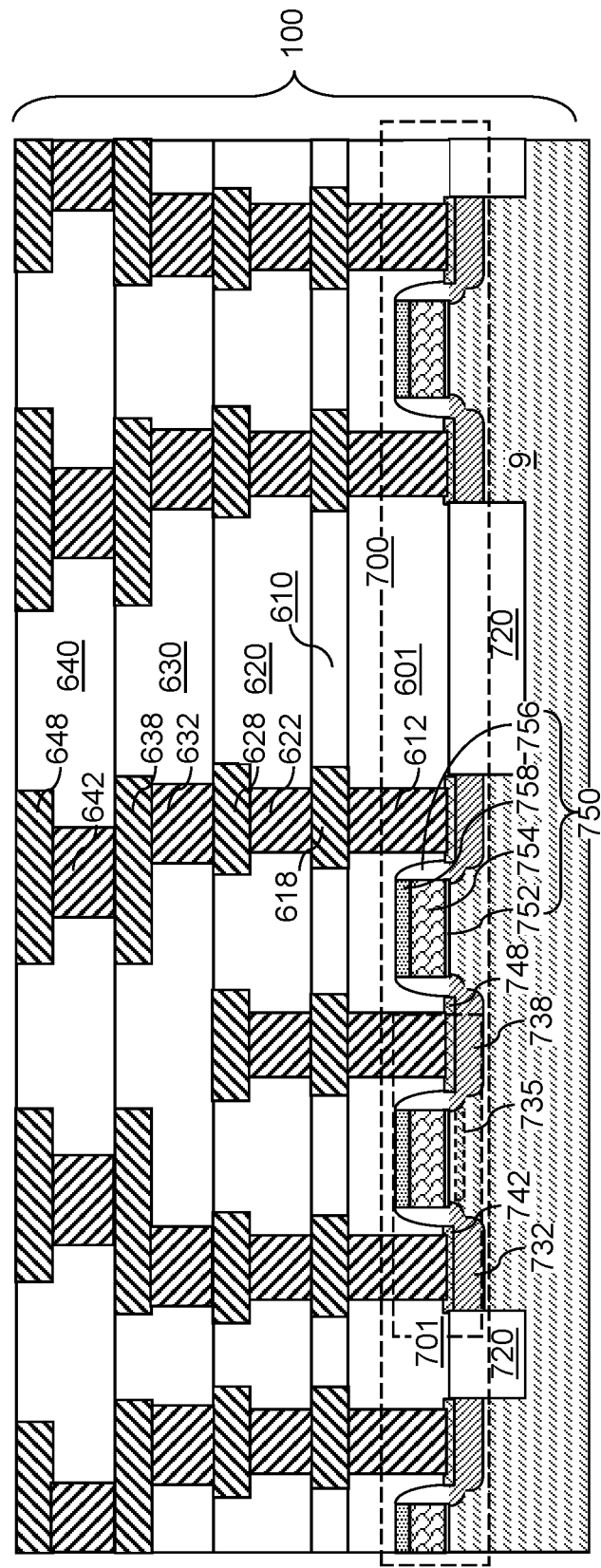
FIG. 1 is a vertical cross-sectional view of an exemplary structure after formation of complementary metal-oxide-semiconductor (CMOS) transistors and metal interconnect structures formed in dielectric layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to back/bottom gate semiconducting metal oxide transistor devices, which may be thin film transistor (TFT) devices and methods of forming the same.

Generally, the structures and methods of the present disclosure may be used to pattern a bottom gate of a TFT in a precise manner to prevent sidewall re-deposition of metallic materials when patterning the source/drain regions and channel regions of an semiconducting metal oxide TFT device. During the fabrication of the semiconducting metal oxide TFT device, a leakage path may be formed between the bottom gate and source/drain regions of a TFT as a result of sidewall re-deposition of metallic material. Re-deposition of metallic material may occur due to the splashing of the bottom gate when $AlO_x/IGZO/AlO_x$ materials are etched. Accordingly, the reliability of the resulting TFT device may be reduced due to sidewall re-deposition of metallic material. In the various embodiments disclosed herein the bottom gates of the TFT may be patterned to prevent re-deposition. The patterned bottom gates may be embedded in a dielectric layer. The top surface of the patterned bottom gate may be co-planar with a top surface of the dielectric layer. The dielectric layer may be provided with openings to define a position and dimension of the patterned bottom gates of the TFT. A conductive material may be formed over the dielectric material to fill the openings that are defined in the dielectric layer. The conductive material may be partially removed to reveal a top surface of the dielectric layer.

In this manner, the dimension and patterning of the patterned bottom gates of the TFT may be precisely controlled. The overlay of the bottom gates and the source/drain regions may be easily controlled. In addition, sidewall re-deposition of metallic materials may be prevented when performing the patterning process of the $AlO_x/IGZO/AlO_x$ materials because the bottom gates may be covered by the $AlO_x/IGZO/AlO_x$ materials. Splashing of the bottom gates may be prevented when performing the patterning process of the $AlO_x/IGZO/AlO_x$ materials because the bottom gates may be covered by the $AlO_x/IGZO/AlO_x$ materials.

FIG. 1 is a vertical cross-sectional view of an exemplary lower level device structure 100 after formation of complementary metal-oxide-semiconductor (CMOS) transistors and metal interconnect structures formed in dielectric layers according to an embodiment of the present disclosure. Referring to FIG. 1, the exemplary lower level device structure 100 includes a substrate 9, which may be a semiconductor substrate such as a commercially available silicon substrate. Shallow trench isolation structures 720 including a dielectric material such as silicon oxide may be formed in an upper portion of the substrate 9. Suitable doped semiconductor wells, such as p-type wells and n-type wells, may be formed within each area that is laterally enclosed by a portion of the shallow trench isolation structures 720. Field effect transistors 701 may be formed over the top surface of the substrate 9. For example, each field effect transistor 701 may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures formed in dielectric layers may be subsequently formed over the substrate 9 and the devices (such as field effect transistors 701). The dielectric layers may include, for example, a contact-level dielectric layer 601, a first interlayer dielectric (ILD) layer 610, a second ILD layer 620, a third ILD layer 630, and a fourth ILD layer 640. The metal interconnect structures may include device contact via structures 612 formed in the contact-level dielectric layer 601 and contacting a respective component of the CMOS circuitry 700, first metal lines 618 formed in the first ILD layer 610, first metal via structures 622 formed in a lower portion of the second ILD layer 620, second metal lines 628 formed in an upper portion of the second ILD layer 620, second metal via structures 632 formed in a lower portion of the third ILD layer 630, third metal lines 638 formed in an upper portion of the third ILD layer 630, third metal via structures 642 formed in a lower portion of the fourth ILD layer 640, and fourth metal lines 648 formed in an upper portion of the fourth ILD layer 640. In one embodiment, the second metal lines 628 may include source lines that are connected to a source-side power supply for an array of memory elements.

Each of the dielectric layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal lines 628 may be formed as integrated line and via structures by a dual-Damascene process, the second metal via structures 632 and the third metal lines 638 may be formed as integrated line and via structures, and/or the third metal via structures 642 and the fourth metal lines 648 may be formed as integrated line and via structures. While the present disclosure is described using an embodiment in which an array of memory cells is formed over the fourth ILD layer 640, embodiments are expressly contemplated herein in which the array of memory cells may be formed at a different metal interconnect level.

The lower level structure 100 illustrated in FIG. 1 may function as a base on which at least one thin film transistor of the present disclosure may be formed. While the present disclosure is described using an embodiment in which the lower level device structure 100 includes four metal line levels used for forming at least one thin film transistor thereupon, embodiments are expressly contemplated herein in which a substrate 100 includes a different number of metal line levels, which may be formed in additional dielectric layers.

Figure 2A:
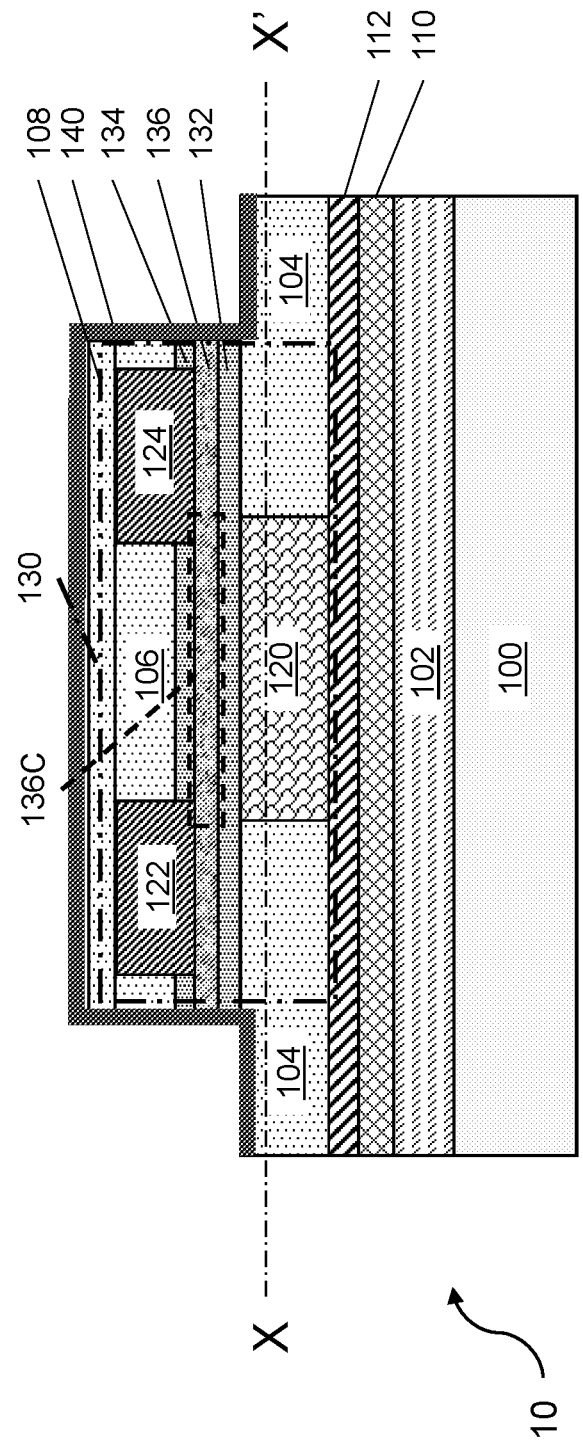
FIG. 2A is a vertical cross-sectional view of a thin-film-transistor (TFT) semiconductor device 10, according to various embodiments of the present disclosure.
Figure 2C:
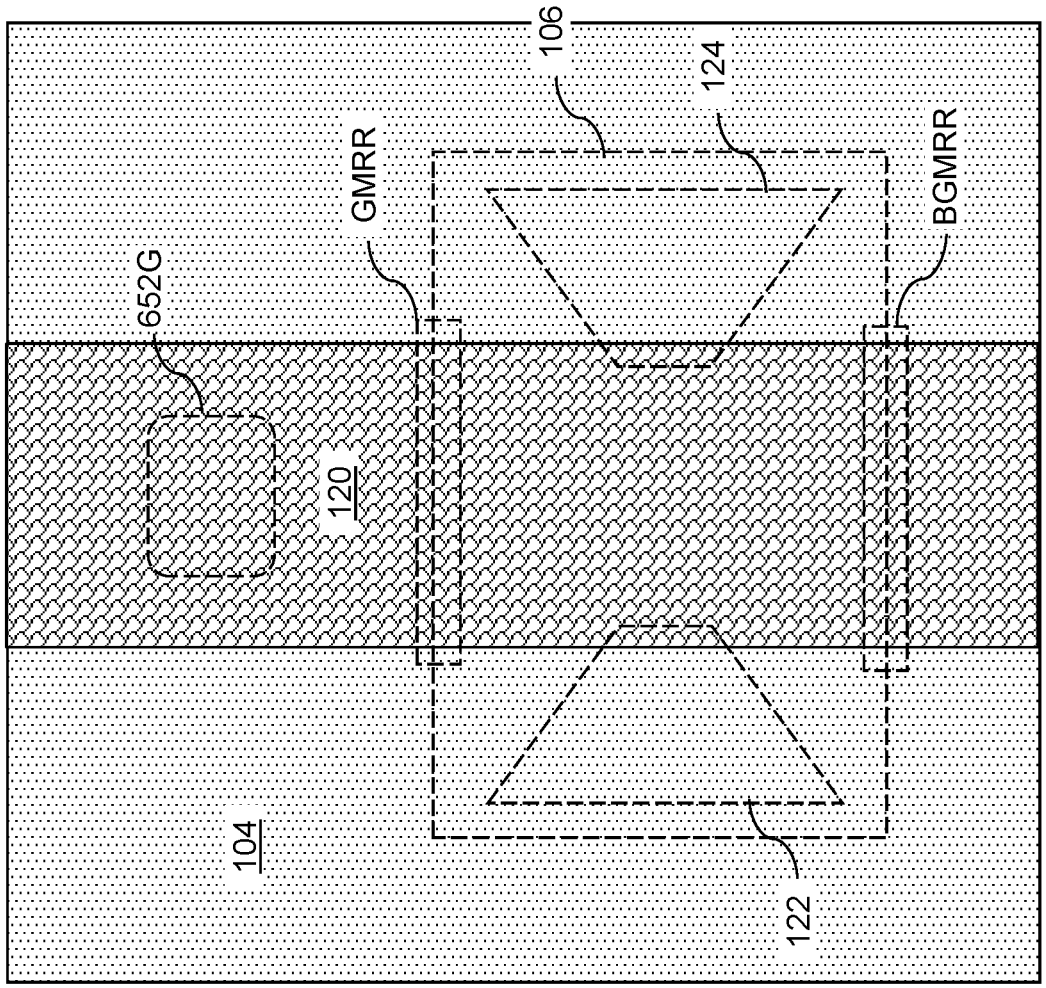
FIG. 2C is a horizontal cross-sectional view along the horizontal plane X-X' of FIG. 2A in embodiments in which the TFT semiconductor device 10 is configured to share a gate electrode 120 with another TFT semiconductor device. Contours of selected overlying structures are illustrated in dotted lines.
Figure 2D:
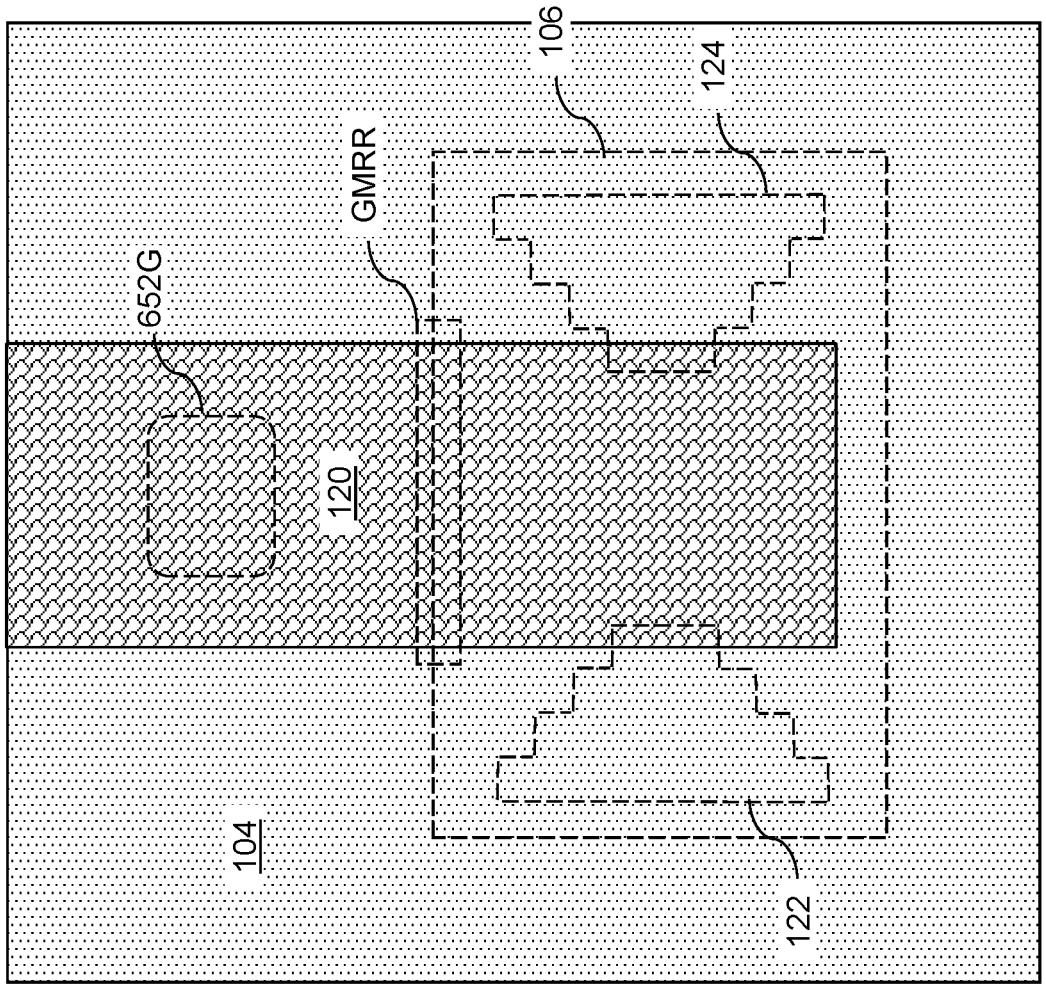
FIG. 2D is a horizontal cross-sectional view along the horizontal plane X-X' of FIG. 2A in embodiments in which the TFT semiconductor device 10 is configured such that a source region and a drain region have a respective horizontal cross-sectional profile of a stepped pyramid. Contours of selected overlying structures are illustrated in dotted lines.

FIG. 2A is a vertical cross-sectional view of a thin-film-transistor (TFT) semiconductor device 10, according to various embodiments of the present disclosure. FIG. 2B is a horizontal cross-sectional view along the horizontal plane X-X' of FIG. 2A in embodiments in which the TFT semiconductor device 10 is configured as a stand-alone TFT semiconductor device that does not share a gate electrode 120 with another TFT semiconductor device. Contours of selected overlying structures are illustrated in dotted lines. FIG. 2C is a horizontal cross-sectional view along the horizontal plane X-X' of FIG. 2A in embodiments in which the TFT semiconductor device 10 is configured to share a gate electrode 120 with another TFT semiconductor device. Contours of selected overlying structures are illustrated in dotted lines. FIG. 2D is a horizontal cross-sectional view along the horizontal plane X-X' of FIG. 2A in embodiments in which the TFT semiconductor device 10 is configured to include a source region and a drain region having a respective horizontal cross-sectional profile of a stepped pyramid. Contours of selected overlying structures are illustrated in dotted lines.

According to an aspect of the present disclosure, at least one TFT semiconductor device 10 may be formed on a lower level device structure 100. The lower level device structure 100 may include at least one interconnect-level dielectric layer. Metal interconnect structures use many dielectric materials that may provide low dielectric constant. Such dielectric materials may include organosilicate glass and its porous derivatives. Advanced low-dielectric materials are continually being developed and are incorporated as dielectric layer in back-end-of-line structures. Unfortunately, most low-k dielectric materials decompose at temperatures higher than 400 degrees Celsius. Further, migration of metal, such as copper, is accelerated at elevated temperatures. At the same time, activation of electrical dopants in field effect transistors using elemental semiconductor materials or III-V compound semiconductor materials requires a thermal anneal at a temperature greater than 700 degrees Celsius. Therefore, formation of a field effect transistor using an elemental semiconductor material or a III-V compound semiconductor material within a metal interconnect structure has not been previously possible in the semiconductor industry.

According to an aspect of the present disclosure, formation of thin film transistors in the metal interconnect levels allows for increased device density. In such embodiments in which thin film transistors are formed in the metal interconnect levels, the thin film transistors may use a semiconducting metal oxide material in which electrical dopants may be activated at low anneal temperatures in a range from 100 degrees Celsius to 300 degrees Celsius. In other words, activation of electrical dopants in semiconducting metal oxide materials do not require a thermal anneal at temperatures higher than 400 degrees Celsius. Moreover, activation of electrical dopants in semiconducting metal oxide materials does not induce thermal decomposition of low dielectric constant materials that may be incorporated into the back-end-of-line metal wiring levels. The TFT semiconductor devices 10 that may be formed on the substrate 100 may thus increase the overall areal device density. In other words, more transistor switches may be incorporated into a semiconductor die in addition to field effect transistors that use portions of the semiconductor material layer 9 as semiconductor channels by forming the TFT semiconductor device 10 of the various embodiments of the present disclosure.

Generally, multiple instances of the embodiment thin film transistors 10 may be used in a metal interconnect level or in multiple metal interconnect levels. While the present disclosure is described using an embodiment in which the TFT semiconductor devices 10 are formed in a single metal interconnect level, embodiments are expressly contemplated herein in which the embodiment TFT semiconductor device 10 may be formed over multiple metal interconnect levels. Generally, the thin film transistors 10 may be formed in any area of a semiconductor die. In some embodiments, the TFT semiconductor device 10 may be formed in a memory array region of a memory die as access or select transistors. In some other embodiments, the embodiment TFT semiconductor device 10 may be formed in a peripheral region or in a logic region to provide a logic circuit. Application of the thin film transistors for various types of known semiconductor circuits is expressly contemplated herein.

The embodiment TFT semiconductor device 10 of the present disclosure provides circuit switching capabilities in addition to the circuit switching capabilities provided by the FEOL field effect transistors 701 in the substrate 100. Thus, areal density of switching devices may be increased. Further, embodiment TFT semiconductor device 10 may provide low leakage current compared to the field effect transistors 701. However, it is noted that the field effect transistors 701 may provide high on-current per device area. These characteristics of the embodiment thin film transistors 10 and the field effect transistors 701 may be advantageously used to provide enhanced circuit functionality. For example, the field effect transistors 701 may be used to provide high current devices, and the TFT semiconductor device 10 may be used to provide low leakage devices.

Referring to FIG. 2A, in an exemplary manufacturing sequence that may form an embodiment TFT semiconductor device 10 of the present disclosure, an interlayer dielectric (ILD) layer 102 may be disposed on the lower level device structure 100. The ILD layer 102 may be formed by any suitable process, such as a deposition process or a thermal oxidation process. The ILD layer 102 may be formed of an oxide material such as silicon dioxide ($SiO_2$) of the like.

A first etch-stop layer 110 may be disposed on the ILD layer 102. The first etch-stop layer 110 may be resistant to etching processes. The first etch-stop layer 110 may include a dielectric material, such as a silicon-containing dielectric material such as silicon nitride, silicon oxynitride, silicon carbide, or silicon carbide nitride. Other suitable materials are within the contemplated scope of disclosure. The first etch stop layer 110 may be formed by a conformal or non-conformal deposition process. In one embodiment, the first etch-stop layer 110 may be formed by chemical vapor deposition, atomic layer deposition, or physical vapor deposition. The thickness of the first etch stop-layer 110 may be in a range from 2 nm to 20 nm, such as from 3 nm to 12 nm, although lesser and greater thicknesses may also be used.

In some embodiments, an optional second etch-stop layer 112 may be formed on the first etch-stop layer 110. The first etch-stop layer 110 and optional second etch-stop layer 112 may be formed of different dielectric materials. The second etch-stop layer 112 may include a dielectric metal oxide material such as aluminum oxide, hafnium oxide, titanium oxide, tantalum oxide, yttrium oxide, and/or lanthanum oxide. Other suitable materials are within the contemplated scope of disclosure. The second etch-stop layer 112 may be deposited by a conformal or non-conformal deposition process. In one embodiment, the optional second etch-stop layer 112 may be formed by chemical vapor deposition (CVD), atomic layer deposition (ALD), or physical vapor deposition (PVD). The thickness of the second etch-stop layer 112 may be in a range from 2 nm to 20 nm, such as from 3 nm to 12 nm, although lesser and greater thicknesses may also be used. In some embodiments, the second etch-stop layer 112 may have a lower etching resistance than the first etch-stop layer 110.

A thin film transistor (TFT) 130 and a first dielectric layer 104 may be disposed on the first or second etch-stop layers 110, 112. The TFT 130 may include a patterned gate electrode 120 disposed in the first dielectric layer 104. The TFT 130 may also include a gate dielectric layer 132, a channel layer 136 with a channel region 136C, a capping layer 134, a source electrode 122, and a drain electrode 124. A third dielectric layer 108 may be disposed over the source and drain electrodes 122, 124.

The channel layer 136 may include a semiconducting metal oxide material. A semiconducting metal oxide material is a metal oxide material that is capable of providing electrical conductivity in a range from 1.0 S/m to $1.0 \times 10^5$ S/m upon suitable doping with electrical dopants (which may be p-type dopants or n-type dopants). In an intrinsic state or under a condition of a low-level electrical doping, a semiconducting metal oxide material may be semiconducting or insulating, and may have electrical conductivity generally in a range from $1.0 \times 10^{-10}$ S/m to $1.0 \times 10$ S/m. Exemplary semiconducting metal oxide materials that may be used for the channel layer 136 include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. In one embodiment, the semiconducting metal oxide material layer may include indium gallium zinc oxide.

The channel layer 136 may include a polycrystalline semiconducting metal oxide material, or an amorphous semiconducting metal oxide material that may be subsequently annealed into a polycrystalline semiconducting metal oxide material having a greater average grain size. The channel layer 136 may be deposited by physical vapor deposition. The thickness of the semiconducting metal oxide material layer may be in a range from 1 nm to 100 nm, such as from 2 nm to 50 nm and/or from 4 nm to 15 nm, although lesser and greater thicknesses may also be used. In one embodiment, the channel layer 136 may be formed by deposition of an amorphous semiconducting metal oxide material, and by a subsequent anneal process that converts the amorphous semiconducting metal oxide material into a polycrystalline semiconducting metal oxide material.

The thickness of the channel layer 136 including the polycrystalline semiconducting metal oxide may be relatively thin compared to field effect transistors using a single crystalline semiconductor channel. Thus, a transistor using a channel region 136 containing the polycrystalline semiconducting metal oxide is referred to as a thin film transistor.

The gate, source, and drain electrodes 120, 122, 124 may be formed of an electrically conductive material using any suitable process. For example, the gate, source, and drain electrodes 120, 122, 124 may be formed of electrically conductive materials, such as aluminum (Al), copper (Cu), tungsten (W), titanium (Ti), tantalum (Ta), gold (Au), platinum (Pt), and/or combinations thereof. Other suitable materials are within the contemplated scope of disclosure.

The first dielectric layer 104, second dielectric layer 106, and third dielectric layer 108 may be formed of any suitable dielectric material, such as silicon oxide ($SiO_2$), silicon nitride, or the like, and may be formed by any suitable process, such as physical vapor deposition (PVD), sputtering, chemical vapor deposition (CVD), atomic layer deposition (ALD), plasma-enhanced chemical vapor deposition (PECVD), or combinations thereof. In some embodiments, the second dielectric layer 106 may operate as a "hard mask" during the formation of source and drain electrodes 122, 124.

As used herein, the dielectric constant or "k value" refers to the relative permittivity of a material at room temperature under a frequency of 1 kHz. The relative permittivity of a material under the above condition is a ratio of the amount of electrical energy stored in a material by an applied voltage, relative to that stored in a vacuum. In other words, it is also the ratio of the capacitance of a capacitor using that material as a dielectric, compared to a similar capacitor that has a vacuum as its dielectric. Under the above condition, silicon dioxide has a k value of 3.9. A high dielectric constant (high-k) material of the present disclosure may have a k values of greater than 3.9.

For example, the gate dielectric layer 132 may be formed of a high-k material such as zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, titanium oxide, a hafnium dioxide-alumina ($HfO_2$—$Al_2O_3$) alloy, combinations thereof, or the like. In some embodiments, the capping layer 134 may also be formed of a high-k material, which may be the same or different than the high-k material of the gate dielectric layer 132.

The capping layer 134 and the gate dielectric layer 132 may be formed by deposition processes, such as physical vapor deposition (PVD), sputtering, chemical vapor deposition (CVD), atomic layer deposition (ALD), plasma-enhanced chemical vapor deposition (PECVD), or combinations thereof.

The channel layer 136 may be disposed between the gate dielectric layer 132 and the capping layer 134. The channel layer 136 may be formed of any suitable semiconductor material. For example, the channel layer 136 may be formed by depositing a thin film of amorphous silicon, microcrystalline silicon, or polysilicon, using any suitable deposition process. In other embodiments, as discussed above, the channel layer 136 may be formed of compound semiconductor materials, such as indium gallium zinc oxide (IGZO), cadmium selenide, or the like. Other suitable channel layer materials are within the contemplated scope of disclosure. In some embodiments, the channel layer 136 may be formed of IGZO and the gate dielectric layer 132 and the capping layer 134 may be formed of aluminum oxide. Thus, the gate dielectric layer 132, channel layer 136, and capping layer 134 may form $AlO_x$/IGZO/$AlO_x$ material layers.

Generally, the first dielectric layer 104 may be formed first, and the gate electrode 120 may be formed within a cavity formed in the first dielectric layer 104. The gate electrode 120 may have a uniform width along a first horizontal direction hd1 and may laterally extend along a second horizontal direction hd2 that is perpendicular to the first horizontal direction hd1. The width of the gate electrode 120 may be in a range from 10 nm to 200 nm, such as from 20 nm to 100 nm, although lesser and greater widths may also be used.

Generally, the gate electrode 120 laterally extends outside the area of the channel layer 136. The gate electrode 120 may have a generally rectangular horizontal cross-sectional shape. The channel layer 136 may also have a rectangular horizontal cross-sectional shape, or a horizontal cross-sectional shape of a rounded rectangle. The channel layer 136 may have a pair of lengthwise sidewalls that laterally extend along the first horizontal direction hd1, and a pair of widthwise sidewalls that laterally extend along the second horizontal direction hd2.

A source electrode 122 and a drain electrode 124 may be electrically coupled with opposing sides of the channel layer 136. In particular, the source electrode 122 and a drain electrode 124 may be disposed in openings formed in the second dielectric layer 106 and the capping layer 134. In various embodiments, the source electrode 122 and a drain electrode 124 may overlap opposing respective edges of the gate electrode 120.

Generally, the source electrode 122 and the drain electrode 124 may be formed by etching a pair of cavities within the second dielectric layer 106 and the capping layer 134. At least one conductive material may then be deposited within the pair of etched cavities. A portion of a top surface of the channel layer 136 may be physically exposed at the bottom of each cavity. According to an aspect of the present disclosure, the shape of each etched cavity may be designed to minimize the effect of the overlay variations between the pattern of the cavities and the pattern of the gate electrode 120.

In one embodiment, the reduction in the effect of overlay variations along the first horizontal direction hd1 may be effected by using a pair of a source electrode 122 and a drain electrode 124 that have a respective trapezoidal horizontal cross-sectional shape as illustrated in FIGS. 2B and 2C. The channel length, i.e., the separation distance between the source electrode 122 and the drain electrode 124 along the first horizontal direction hd1 is fixed by the lithographic pattern that forms the cavities that the source electrode 122 and the drain electrode 124 subsequently fill. In such embodiments, the variations in the capacitive coupling between the channel layer 136 and each of the source electrode 122 and the drain electrode 124 may be minimized by reducing the dimension of the source electrodes 122 and the drain electrodes 124 that overlap with the channel layer 136 by using the trapezoidal horizontal cross-sectional shape for each of the source electrode 122 and the drain electrode 124.

Further, alternative shapes may be used for the horizontal cross-sectional shapes of the source electrode 122 and the drain electrode 124. FIG. 2D illustrates a configuration in which each of the source electrode 122 and the drain electrode 124 has a respective horizontal cross-sectional shape of a stepped pyramid. The lateral dimension of each of the source electrode 122 and the drain electrode 124 is less in proximal portions that overlap the gate electrode 120 than in distal portions that do not overlap the gate electrode 120.

Generally, the gate electrode 120 laterally extends outside the area of the channel layer 136 to enable contact by a gate contact via structure 652G, which may be one of the metal via structures to be subsequently formed (see e.g., FIG. 7). The gate electrode 120 may cross one of the lengthwise edges of the channel layer 136 that laterally extends along the first horizontal direction hd1 in a plan view, i.e., a view along a vertical direction. As shown in FIGS. 2B-2D, the edges of channel layer 136 are vertically coincident with the edges of second dielectric layer 106. In one embodiment, the TFT semiconductor device 10 may be formed as a stand-alone TFT semiconductor device 10. In this embodiment, the gate electrode 120 may be configured to laterally extend outward from the area enclosed by the periphery of the channel layer 136 only along one side of the area enclosed by the periphery of the channel layer 136, e.g., from underneath a lengthwise sidewall of the channel layer 136 that laterally extends along the first horizontal direction hd1 as illustrated in FIGS. 2B and 2D. Alternatively, the TFT semiconductor device 10 may be one of multiple TFT semiconductor devices 10 arranged in a row and sharing a common gate electrode 120. In this embodiment, the gate electrode 120 may be configured to laterally extend outward from the area enclosed by the periphery of the channel layer 136 along both sides of the area enclosed by the periphery of the channel layer 136, e.g., from underneath both lengthwise sidewalls of the channel layer 136 that laterally extend along the first horizontal direction hd1 as illustrated in FIG. 2C.

According to an aspect of the present disclosure, the gate electrode 120 of the present disclosure is patterned to provide an overlap area with the area of the channel layer 136 that is only a fraction of the area of the channel layer 136. For example, the ratio of the overlap area between the gate electrode 120 and the channel layer 136 in a plan view to the total area of the channel layer 136 may be in a range from 0.02 to 0.4, such as from 0.04 to 0.2, although lesser and greater ratios may also be used.

The total length of the edge of sidewalls of the channel layer 136 (and vertically coincident edge of the second dielectric layer 106) that overlies the gate electrode 120 may be the same as the width of the gate electrode 120 along the first horizontal direction in the configurations of FIGS. 2B and 2D. The total length of the edge of sidewalls of the channel layer 136 that overlies the gate electrode 120 may be the same as twice the width of the gate electrode 120 along the first horizontal direction hd1 in the configuration of FIG. 2C. The patterned gate electrode 120 of the present disclosure may be configured to avoid a configuration in which a gate electrode overlaps the entire area of a channel layer 136, and the entire periphery of a channel layer 136 overlaps with the gate electrode.

According to an aspect of the present disclosure, reducing the total length of edges of the channel layer 136 to the width of the gate electrode 120 along the first horizontal direction hd1 or twice the width of the gate electrode 120 along the first horizontal direction hd1 provides the advantage of reducing the total area in which re-sputtering of the conductive material of the gate electrode 120 may potentially occur during patterning of the second dielectric layer 106. Thus, the total area of a gate material re-sputtering region GMRR is reduced in embodiments of the present disclosure relative to prior art devices using larger gate patterns. Reduction of the total area of the gate material re-sputtering region GMRR provides the advantage of reducing electrical shorts (i.e., unintended electrical coupling) within the TFT semiconductor device 10 of the present disclosure.

The third dielectric layer 108 may be disposed on the source electrode 122 and drain electrode as well as on the second dielectric layer 106. Portions of the first dielectric layer 104 may be exposed outside of the TFT 130. The portions may include pads (not shown) of the gate electrode 120 used for probing operation the TFT 130.

A protective layer 140 may be disposed on the third dielectric layer 108 and may cover side walls of the second dielectric layer 106, the capping layer 134, the channel layer 136, and the gate dielectric layer 132. The protective layer 140 may also cover and directly contact the exposed portions of the first dielectric layer 104.

FIG. 3 is a cross-sectional view of a TFT semiconductor device 20, according to various embodiments of the present disclosure. The TFT semiconductor device 20 may be similar to the TFT semiconductor device 10 of FIGS. 2A-2D, accordingly the differences there between will be discussed in detail herein.

Referring to FIG. 3, the semiconductor device 20 includes a gate electrode 120 that may extend into the second etch-stop layer 112. In particular, the gate electrode 120 may be formed in an opening that extends through the first dielectric layer 104 and partially through the second etch-stop layer 112. In other words, the bottom surface of the gate electrode 120 may be disposed within of the second etch-stop layer 112.

FIG. 4 is a cross-sectional view of a TFT semiconductor device 30, according to various embodiments of the present disclosure. The TFT semiconductor device 30 may be similar to the TFT semiconductor device 10 of FIGS. 2A-2D and TFT semiconductor device 20 of FIG. 3, accordingly the differences there between will be discussed in detail herein.

Referring to FIG. 4, the TFT semiconductor device 30 includes a gate electrode 120 that extends completely through the second etch-stop layer 112. In particular, the gate electrode 120 may be formed in an opening that extends completely through both the first dielectric layer 104 and the second etch-stop layer 112. In other words, the bottom surface of the gate electrode 120 is disposed directly on the top surface of the first etch-stop layer 110.

FIG. 5 is a cross-sectional view of a TFT semiconductor device 40, according to various embodiments of the present disclosure. The TFT semiconductor device 40 may be similar to the TFT semiconductor device 10 of FIGS. 2A-2D, TFT semiconductor device 20 of FIG. 3, and TFT semiconductor device 30 of FIG. 4, accordingly the differences there between will be discussed in detail herein.

Referring to FIG. 5, the TFT semiconductor device 40 includes the first etch-stop layer 110 but does not include a second etch-stop layer 112. In addition, the TFT semiconductor device 40 includes a TFT 130A, which includes a gate dielectric layer 132. The gate dielectric layer 132 includes a first gate dielectric layer 32A and a second gate dielectric layer 32B disposed between the gate dielectric layer 132 and the gate electrode 120.

FIG. 6 is a cross-sectional view of a TFT semiconductor device 50, according to various embodiments of the present disclosure. The TFT semiconductor device 50 may be similar to the TFT semiconductor device 40 of FIG. 5, accordingly the differences there between will be discussed in detail herein.

Referring to FIG. 6, the TFT semiconductor device 50 includes a gate electrode 120 that extends into the first etch-stop layer 110. In particular, the gate electrode 120 may be formed in a trench that extends through the first dielectric layer 104 and partially through the first etch-stop layer 110. In other words, the bottom surface of the gate electrode may be disposed within of the first etch-stop layer 110. The gate electrode 120 may be coupled to FEOL transistors below the TFT semiconductor device 50 through metal interconnect structures (e.g., 612, 618, 622, 628, 632, 638, 642, 648) or to nodes formed above the TFT semiconductor device 50 through metal interconnect structures (e.g., 652G, 658, 662, 668).

Figure 7:
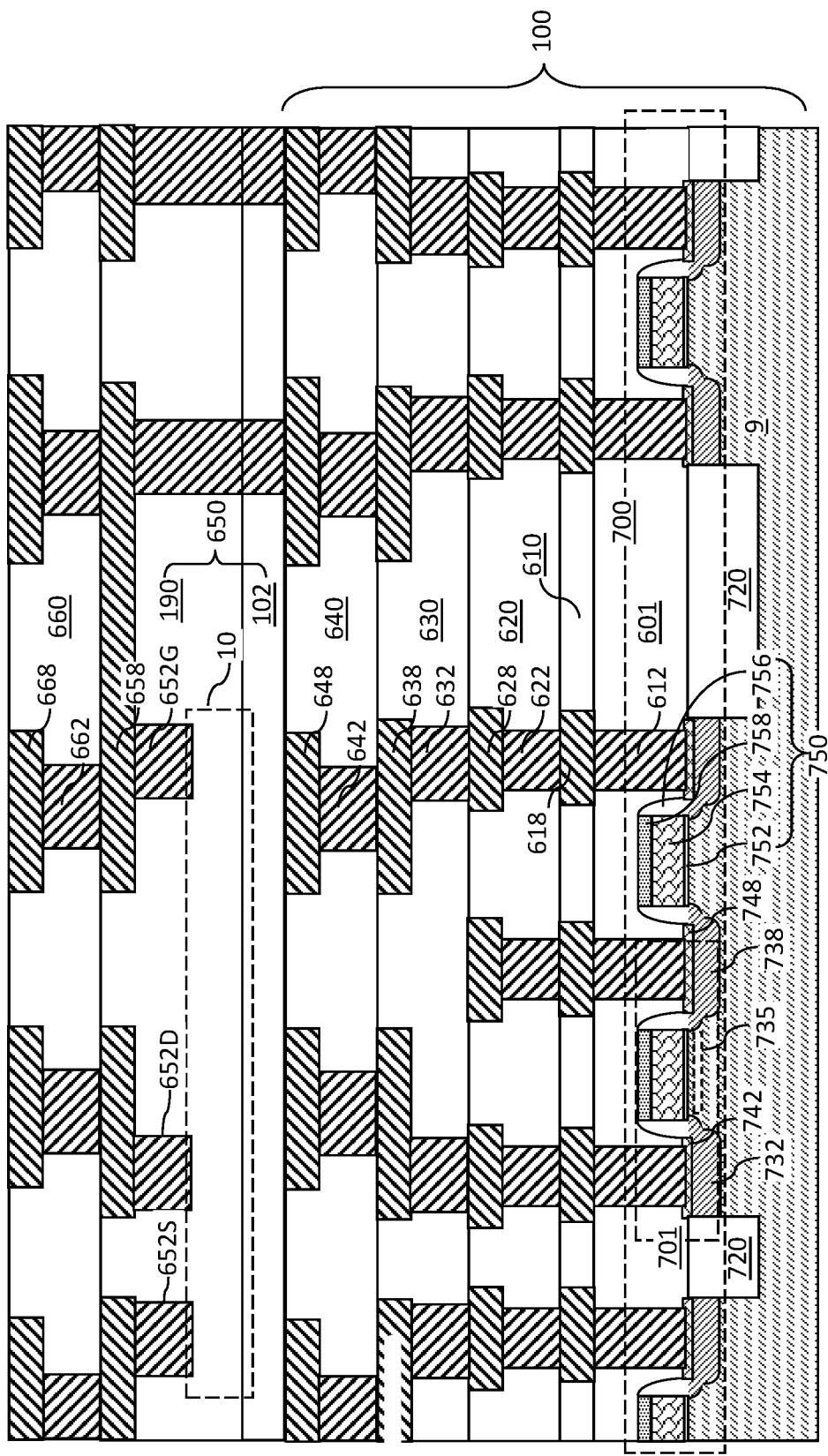
FIG. 7 is a vertical cross-sectional view of the exemplary structure after formation of upper-level metal interconnect structures according to an embodiment of the present disclosure.

Referring to FIG. 7, the exemplary structure is illustrated after formation of additional dielectric layers and metal interconnect structures on a lower level device structure 100. For example, a TFT-level dielectric layer 190 may be deposited over at least one TFT semiconductor device (10, 20, 30, 40, 50), which may include an array of TFT semiconductor devices 10. The TFT-level dielectric layer 190 may include any of the interconnect-level dielectric materials that may be used for the dielectric layers (601, 610, 620, 630, 640, 650, 660). The combination of all dielectric layers between, and including, the ILD layer 102 and the TFT-level dielectric layer 190 constitutes a fifth ILD layer 650. Fourth metal via structures 652 and fifth metal lines 658 may be formed within the fifth ILD layer 650.

For example, a first photoresist layer (not shown) may be applied over the fifth ILD layer 650 and may be lithographically patterned to form a pattern of line-shaped trenches or pad-shaped trenches. A first anisotropic etch process may be performed to form line trenches and/or pad trenches in an upper portion of the fifth ILD layer 650. The line trenches and/or the pad trenches may overlie a respective node of a TFT semiconductor device (10, 20, 30, 40, 50). The first photoresist layer may be removed, and a second photoresist layer may be applied over the fifth ILD layer 650. The second photoresist layer may be lithographically patterned to form discrete openings located within the areas of the line trenches and/or pad trenches. A second anisotropic etch process may be performed to form via cavities in areas that underlie the openings in the second photoresist layer. Each of the via cavities may vertically extend to a respective node of a TFT semiconductor device 10, which may include a gate electrode 120, a source electrode 122, or a drain electrode 124. For example, a first subset of the via cavities may vertically extend to a top surface of a respective one of the source electrodes 122. A second subset of the via cavities may vertically extend to a top surface of a respective one of the drain electrodes 124. A third subset of the via cavities may vertically extend to a top surface of a respective one of the gate electrodes 120. The second photoresist layer may be subsequently removed, for example, by ashing. Integrated line and via cavities and optional pad cavities may be formed in the fifth ILD layer 650. Each integrated line and via cavity may include a line cavity and at least one via cavity. Each pad cavity may include a void configured to form a metal pad therein. Subsequent sixth ILD layer 660 is formed. Fifth metal via structures 662 and sixth metal lines 668 may be formed within the sixth ILD layer 660.

At least one conductive material such as a combination of a conductive metallic nitride liner and a conductive metallic fill material layer may be deposited in each of the cavities in the fifth ILD layer 650. For example, the conductive metallic nitride liner may include a conductive metallic material such as TiN, TaN, and/or WN. The conductive metallic fill material layer may include a metallic fill material such as W, Ti, Ta, Mo, Ru, Co, Cu, another elemental metal, or an intermetallic alloy. Excess portions of the at least one conductive material may be removed from above the horizontal plane including the top surface of the fifth ILD layer 650. Remaining portions of the at least one conductive material comprise fourth metal via structures 652 and fifth metal lines 658. Each contiguous combination of a fifth metal line 658 and at least one fourth metal via structure 652 forms an integrated line and via structure (652, 658). The fourth metal via structures 652 may include source contact via structures 652S, drain contact via structures 652D, and gate contact via structures 652G, which may be electrically connected to a TFT.

Figure 8C:
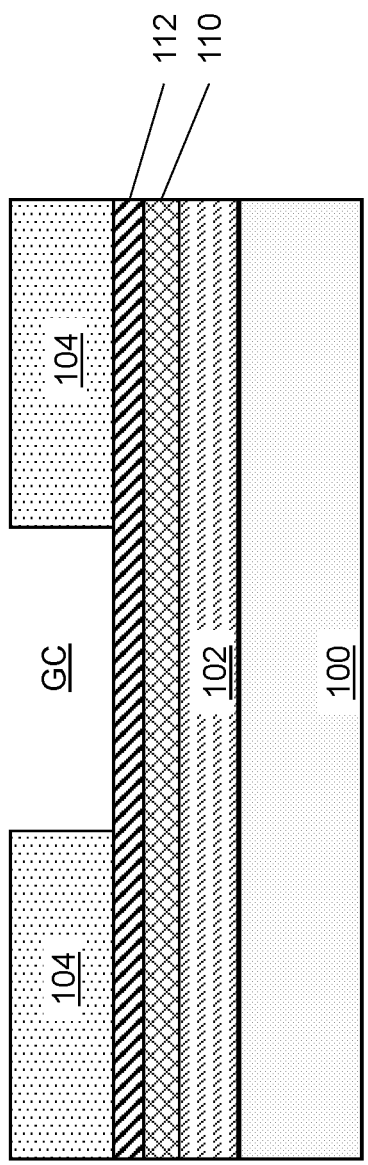

FIGS. 8A-8K are cross-sectional views illustrating the various operations and intermediate structures that may be formed in a method of forming the semiconductor device 10 of FIGS. 2A-2D, according to various embodiments of the present disclosure. Referring to FIG. 8A, an ILD layer 102, a first etch-stop layer 110, an optional second etch-stop layer 112, and a first dielectric layer 104 may be sequentially deposited over the substrate 100.

The ILD layer 102 may include a dielectric material such as silicon oxide and may have a thickness in a range from 30 nm to 300 nm, such as from 60 nm to 150 nm, although lesser and greater thicknesses may also be used. The ILD layer 102 may be deposited, for example, by chemical vapor deposition on a lower device structure 100.

The first etch-stop layer 110 includes a dielectric material that may provide higher etch resistivity than the material of the first dielectric layer 104 during a subsequent anisotropic etch process. The first etch-stop layer 110 may include silicon nitride or a dielectric metal oxide (such as aluminum oxide, hafnium oxide, titanium oxide, etc.). Other suitable materials are within the contemplated scope of disclosure. The thickness of the first etch-stop layer 110 may be in a range from 5 nm to 30 nm, although lesser and greater thicknesses may also be used. The first etch-stop layer 110 may be deposited, for example, by chemical vapor deposition.

The second etch-stop layer 112 may include a dielectric material that provides higher etch resistivity than the material of the first dielectric layer 104 during a subsequent anisotropic etch process. The second etch-stop layer 112 may include silicon nitride, silicon carbide nitride, or a dielectric metal. Generally, the second etch-stop layer 112 includes an etch stop material that is different from the etch stop material of the first etch-stop layer 112. The thickness of the second etch-stop layer 112 may be in a range from 5 nm to 30 nm, although lesser and greater thicknesses may also be used. The second etch-stop layer 112 may be deposited, for example, by chemical vapor deposition.

The first dielectric layer 104 includes a dielectric material such as undoped silicate glass or a doped silicate glass. The thickness of the first dielectric layer 104 may be in a range from 30 nm to 300 nm, such as from 60 nm to 150 nm, although lesser and greater thicknesses may also be used. The first dielectric layer 104 may be deposited, for example, by chemical vapor deposition.

Referring to FIG. 8B, a photoresist material may be deposited on the first dielectric layer 104. The photoresist material may then be patterned through photolithographic techniques to form a photoresist pattern PR. The photoresist pattern PR may mask portions of the first dielectric layer 104 and expose a portion of the first dielectric layer 104.

Referring to FIGS. 8B and 8C, the first dielectric layer 104 may be etched, using the photoresist pattern PR as a mask, to form a gate channel GC opening in the first dielectric layer 104. The gate channel GC opening may extend through the first dielectric layer 104 to expose a portion of the second etch-stop layer 112. As noted above, in some embodiments, the etch process to form the gate channel GC opening may continue until the top surface of the second etch-stop layer 112 may be exposed (See semiconductor device 10 in FIGS. 2A-2D). In other embodiments, the etch process to form the gate channel GC opening may continue until portions of the second etch-stop layer 112 may be etched (See semiconductor device 20 in FIG. 3). In still other embodiments, the etch process to form the gate channel GC opening may continue until the top surface of the first etch-stop layer 110 may be exposed (See semiconductor device 30 in FIG. 4).

Figure 8D:
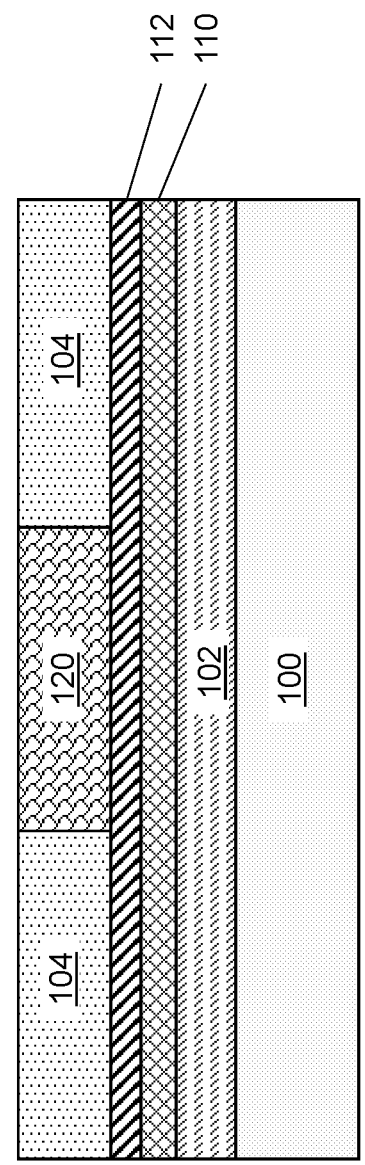

Referring to FIGS. 8C and 8D, at least one conductive material (i.e., at least one electrically conductive material) may be deposited on the first dielectric layer 104 to form a gate electrode 120 in the gate channel GC opening. The at least one electrically conductive material may be deposited using any suitable deposition process as described above. The electrically conductive material may include materials such as aluminum (Al), copper (Cu), tungsten (W), titanium (Ti), tantalum (Ta), gold (Au), platinum (Pt), Titanium Aluminum (TiAl), Titanium Nitride (TiN), or Tantalum Nitride (TaN), and/or combinations thereof. Other suitable materials are within the contemplated scope of disclosure.

A polishing process, such as a chemical mechanical polishing (CMP) process may then be performed to remove the excess portion of the at least one conductive material from above the horizontal plane including the top the surface of the first dielectric layer 104. A remaining portion of the at least one conductive material filling the gate cavity constitutes a gate electrode 120. The top surfaces of the gate electrode 120 and the first dielectric layer 104 may be co-planar. Generally, the first etch-stop layer 110 may be located between the substrate 100 and the first dielectric layer 104. A bottom surface of the gate electrode 120 may contact a surface of the first etch-stop layer 110 which is a topmost surface or a recessed surface the first etch-stop layer 110.

Referring to FIG. 8E, a high-k gate dielectric layer 132 may be deposited over the substantially co-planar surface of the gate electrode 120 and the first dielectric layer 104. The gate dielectric layer 132 may be formed of a high-k material such as zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, titanium oxide, a hafnium dioxide-alumina ($HfO_2$—$Al_2O_3$) alloy, combinations thereof, or the like.

A channel layer 136 may be deposited on the gate dielectric layer 132. The channel layer 136 may be formed of any suitable semiconductor material. For example, the channel layer 136 may be formed by depositing a thin film of amorphous silicon, microcrystalline silicon, or polysilicon, using any suitable deposition process. In other embodiments, the channel layer 136 may be formed of compound semiconductor materials, such as indium gallium zinc oxide (IGZO), cadmium selenide, or the like. Other suitable channel layer materials are within the contemplated scope of disclosure.

A capping layer 134 may be deposited on the channel layer 136. In some embodiments, the capping layer 134 may also be formed of a high-k material, which may be the same or different than the high-k material of the gate dielectric layer 132. In some embodiments, the channel layer 136 may be formed of IGZO and the gate dielectric layer 132 and the capping layer 134 may be formed of aluminum oxide. Thus, the gate dielectric layer 132, channel layer 136, and capping layer 134 may form $AlO_x$/IGZO/$AlO_x$ material layers.

A second dielectric layer 106 may be deposited on the capping layer 134, by utilizing one or more deposition processes as described above.

Referring to FIG. 8F, a photoresist material may be deposited on the second dielectric layer 106 and patterned through photolithographic techniques to form a photoresist pattern PR. The photoresist pattern PR may mask portions of the second dielectric layer 106 and expose other portions of the second dielectric layer 106.

Referring to FIGS. 8F and 8G, an etching process, such as a wet or dry etching process may be performed using the photoresist pattern PR as a mask, to form a source opening SC and a drain opening DC. The source and drain openings (SC, DC) may extend through portions of the second dielectric layer 106 and the capping layer 134 exposed through the photoresist pattern PR, and may expose portions of the channel layer 136. The photoresist pattern PR may then be removed, for example, by ashing.

Referring to FIG. 8H, an electrically conductive layer may be deposited on the second dielectric layer 106, so as to form source and drain electrodes 122, 124 in the source and drain openings SC, DC, respectively. The electrically conductive material may be deposited using any suitable deposition process as described above.

A CMP process may then be performed to planarize the second dielectric layer 106 and the source and drain electrodes 122, 124 to be co-planar. Thus, the top surface of the source electrode 122 and the top surface of the drain electrode 124 may be located within a horizontal plane including the top surface of the second dielectric layer 106.

A periphery of the top surface of the source electrode 122 and a periphery of the top surface of the drain electrode 124 may be located entirely within an area of the channel layer 136.

Figure 8I:
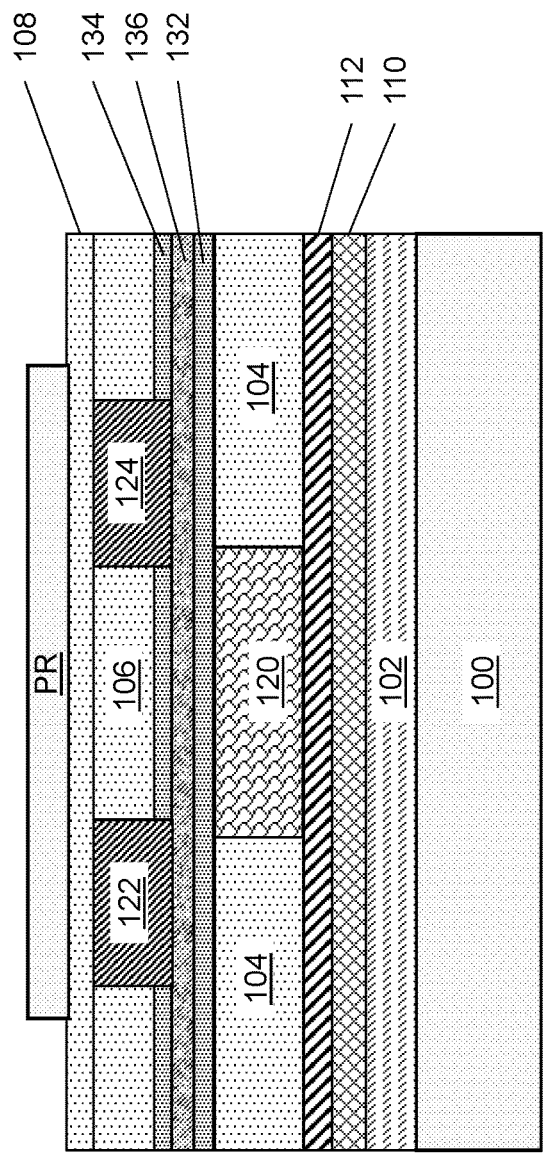

Referring to FIG. 8I, a third dielectric layer 108 may be deposited over the second dielectric layer 106 and the source and drain electrodes 122, 124. A photoresist material may be deposited on the third dielectric layer 108 and patterned through photolithographic techniques to form a photoresist pattern PR.

Figure 8J:
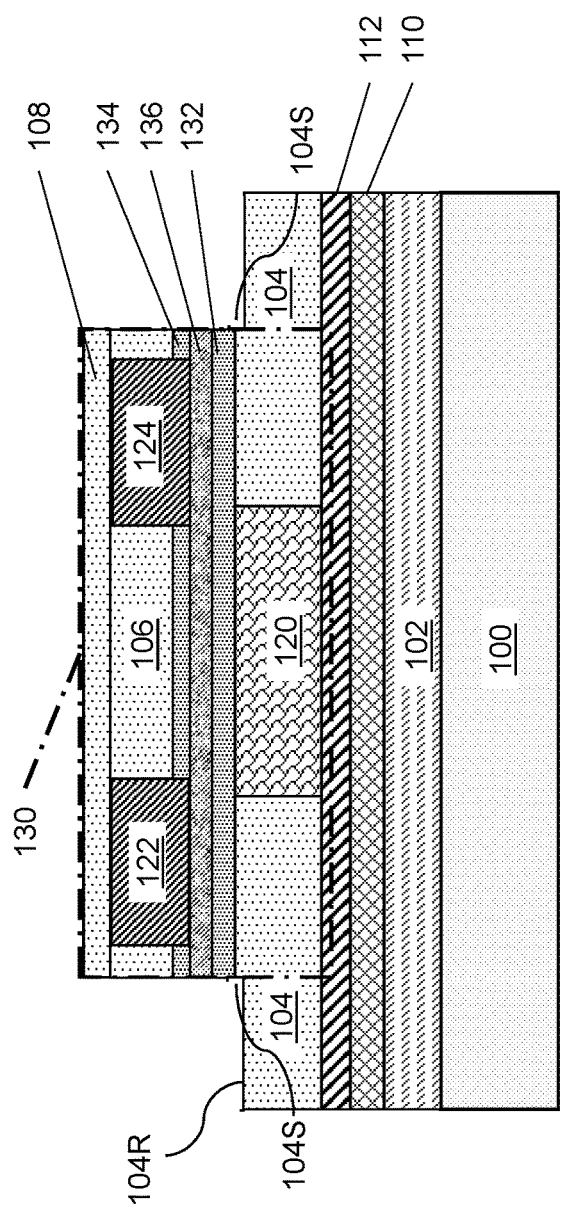

Referring to FIGS. 8I and 8J, an etching process such as a reactive ion etch process may be performed, using the photoresist pattern PR as a mask, in order to etch exposed portions of the third dielectric layer 108 as well as underlying portions of the second dielectric layer 106, the capping layer 134, the channel layer 136 and gate dielectric layer 132. An anisotropic etch process etches the unmasked portions of the third dielectric layer 108, the second dielectric layer 106, the capping layer 134, the channel layer 136, and the gate dielectric layer 132 and vertically recesses unmasked portions of a surface region of the first dielectric layer. A recessed horizontal surface 104R of the first dielectric layer 104 may be physically exposed outside the area of the photoresist pattern PR. In this embodiment, the first dielectric layer 104 comprises a top horizontal surface that contacts the gate dielectric layer 132 and a recessed horizontal surface 104R that does not underlie the gate dielectric layer 132. The recess depth into the first dielectric layer 104 may be in a range from 1 nm to 30 nm, such as from 3 nm to 10 nm, although lesser and greater recess depths may also be used. The recess depth depends on the duration of the final over-etch step during the anisotropic etch process. The area of the photoresist pattern PR defines the area of a thin film transistor 130.

A set of sidewall segments 104S of the first dielectric layer 104 adjoins the top horizontal surface of the first dielectric layer 104 that contacts the gate dielectric layer 132 and the recessed horizontal surface 104R of the first dielectric layer 104. Generally, sidewalls of the patterned portions of the third dielectric layer 108, the second dielectric layer 106, the capping layer 134, the channel layer 136, the gate dielectric layer 132, and the first dielectric layer 104 may be formed within the same vertical planes. In one embodiment, the photoresist pattern PR may have a rectangular horizontal cross-sectional shape or a horizontal cross-sectional shape of a rounded rectangle, four vertical planes containing sidewalls of the photoresist pattern PR may contain sidewalls of the patterned portions of the third dielectric layer 108, the second dielectric layer 106, the capping layer 134, the channel layer 136, the gate dielectric layer 132, and the first dielectric layer 104. In this embodiment, sidewalls of the patterned portions of the third dielectric layer 108, the second dielectric layer 106, the capping layer 134, the channel layer 136, the gate dielectric layer 132, and the first dielectric layer 104 may be vertically coincident. A first surface and a second surface are vertically coincident if the second surface overlies or underlies the first surface, and the first surface and the second surface are contained within a same vertical plane.

In this embodiment, the set of sidewall segments 104S of the first dielectric layer 104 and sidewalls of the patterned portions of the third dielectric layer 108, the second dielectric layer 106, the capping layer 134, the channel layer 136, the gate dielectric layer 132, and the first dielectric layer 104 may be located within a same set of vertical planes. Each vertical plane including a sidewall of the channel layer 136 may contain a sidewall of the third dielectric layer 108, a sidewall of the second dielectric layer 106, a sidewall of the capping layer 134, a sidewall of the gate dielectric layer 132, and a sidewall segments 104S of the first dielectric layer 104 (i.e., a sidewall of a portion of the first dielectric layer 104 that protrudes above the horizontal plane including the recessed horizontal surface 104R of the first dielectric layer 104).

Referring to FIG. 8K, a protective layer 140 may be deposited on the TFT 130 using any suitable deposition process as described above. The protective layer 140 may cover a top surface and sidewalls of the TFT 130. The protective layer 140 may also cover and directly contact the exposed portion of the first dielectric layer 104, which surrounds the TFT 130. The etching process may collaterally recess unmasked portions of the first dielectric layer 104. In this embodiment, a recess sidewall of the first dielectric layer 104 may have an upper edge that coincides with a sidewall of a gate dielectric layer 132.

Referring to FIG. 8K, an optional protective layer 140 may be deposited on the physically exposed surfaces to provide device encapsulation. For example, the protective layer 140 may include silicon nitride. In one embodiment, the protective layer 140 may be deposited on the TFT 130, on the sidewalls of the second dielectric layer 106, and on the exposed portion of the first dielectric layer 104. Subsequently, the TFT-level dielectric layer 190 may be deposited, and various metal interconnect structures including source contact via structures 652S, drain contact via structures 652D, and gate contact via structures 652G may be formed. Each source contact via structure 652S may be formed on a top surface of a respective source electrode 122. Each drain contact via structure 652D may be formed on a top surface of a respective drain electrode 124. Each gate contact via structure 652G (as shown in FIGS. 2B-2D) may be formed on a top surface of a respective gate electrode 120).

Figure 9B:
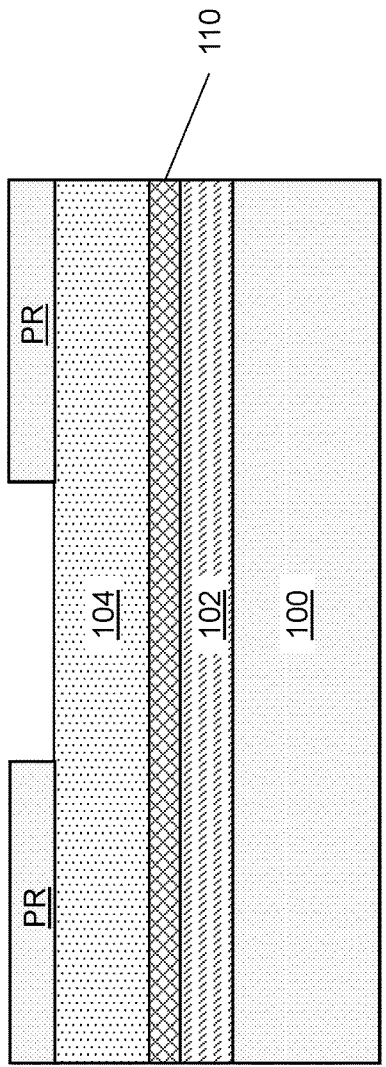

FIGS. 9A-9K are cross-sectional views illustrating an alternative embodiment method of forming the semiconductor device 40 of FIG. 5, according to various embodiments of the present disclosure. Referring to FIG. 9A, the alternative embodiment method is similar to the method described above in that it includes the operation of depositing an ILD layer 102 on a substrate 100. The embodiment method further includes the operation of depositing a first etch-stop layer 110 on the ILD layer 102. In contrast to the embodiment method described above with reference to FIGS. 2A-2D, 3, 4, and 8A-8K, the instant embodiment method omits the deposition of a second etch-stop layer 112 on the first etch-stop layer 110. Rather, the instant embodiment method includes the operation of depositing a first dielectric layer 104 on the first etch-stop layer 110.

The layers 102, 110, 104 may be deposited by any suitable deposition process, such as physical vapor deposition (PVD), sputtering, chemical vapor deposition (CVD), atomic layer deposition (ALD), plasma-enhanced chemical vapor deposition (PECVD), or combinations thereof.

Referring to FIG. 9B, a photoresist material may be deposited on the first dielectric layer 104. The photoresist material may then be patterned through photolithographic techniques to form a photoresist pattern PR. The photoresist pattern PR may mask portion of the first dielectric layer 104 and expose another portion of the first dielectric layer 104.

Figure 9C:
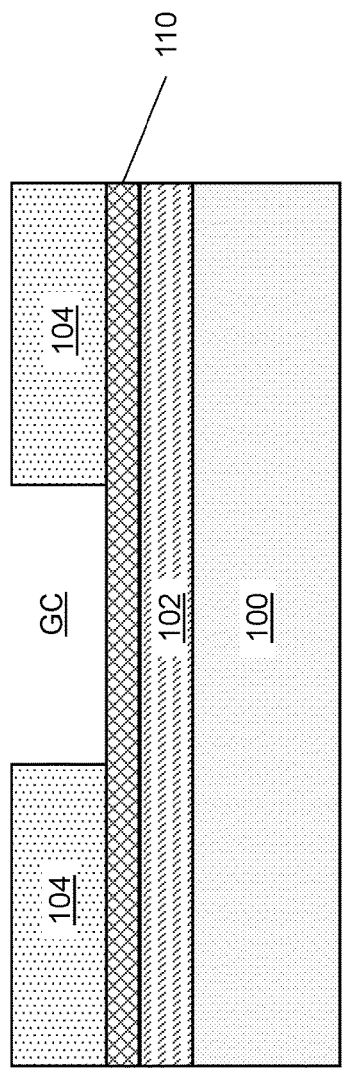

Referring to FIGS. 9B and 9C, the first dielectric layer 104 may be etched, by using a wet or dry etching process for example, using the photoresist pattern PR as a mask, to form a gate cavity GC in the first dielectric layer 104. The gate cavity GC may extend through the first dielectric layer 104 to expose a portion of the first etch-stop layer 110.

Figure 9D:
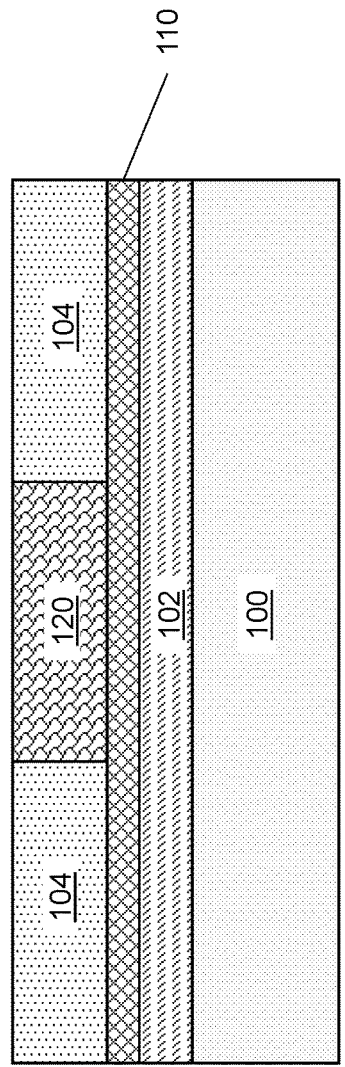

Referring to FIGS. 9C and 9D, at least one electrically conductive material may be deposited on the first dielectric layer 104 to form a gate electrode 120 in the gate cavity GC. The electrically conductive material may be deposited using any suitable deposition process as described above. A polishing process, such as a chemical mechanical polishing (CMP) process may then be performed to remove the excess portions of the at least one conductive material from the surface of the first dielectric layer 104. A remaining portion of the at least one conductive material filling the gate cavity constitutes a gate electrode 120. The top surfaces of the gate electrode 120 and the first dielectric layer 104 may be co-planar. Generally, the first etch-stop layer 110 may be located between the substrate 100 and the first dielectric layer 104. A bottom surface of the gate electrode 120 may contact a surface of the first etch-stop layer 110 which is a topmost surface or a recessed surface the first etch-stop layer 110.

Figure 9E:
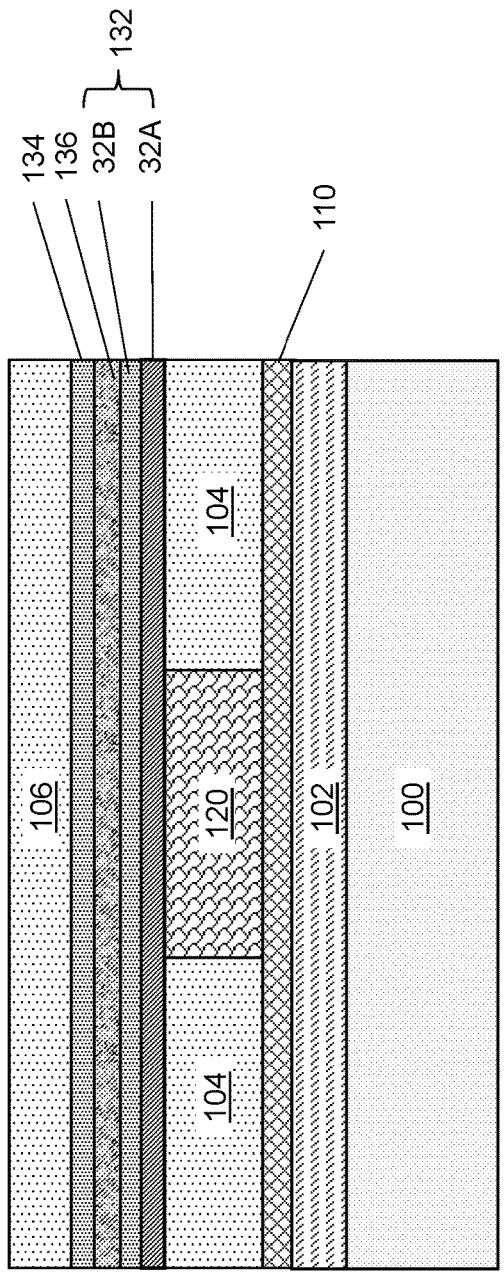

Referring to FIG. 9E, a first gate dielectric layer 32A may be deposited on the gate electrode 120 and the first dielectric layer 104. A second gate dielectric layer 32B may be deposited on the first gate dielectric layer 32A. The stack of the first gate dielectric layer 32A and the second gate dielectric layer 32B comprises a gate dielectric layer 132. A channel layer 136 may be deposited on the second gate dielectric layer 132. A capping layer 134 may be deposited on the channel layer 136. A second dielectric layer 106 may be deposited on the capping layer 134. Each of the first gate dielectric layer 32A, second gate dielectric layer 32B, channel layer 136, capping layer 134, and second dielectric layer 106 may be deposited using one or more deposition processes as described above.

Figure 9F:
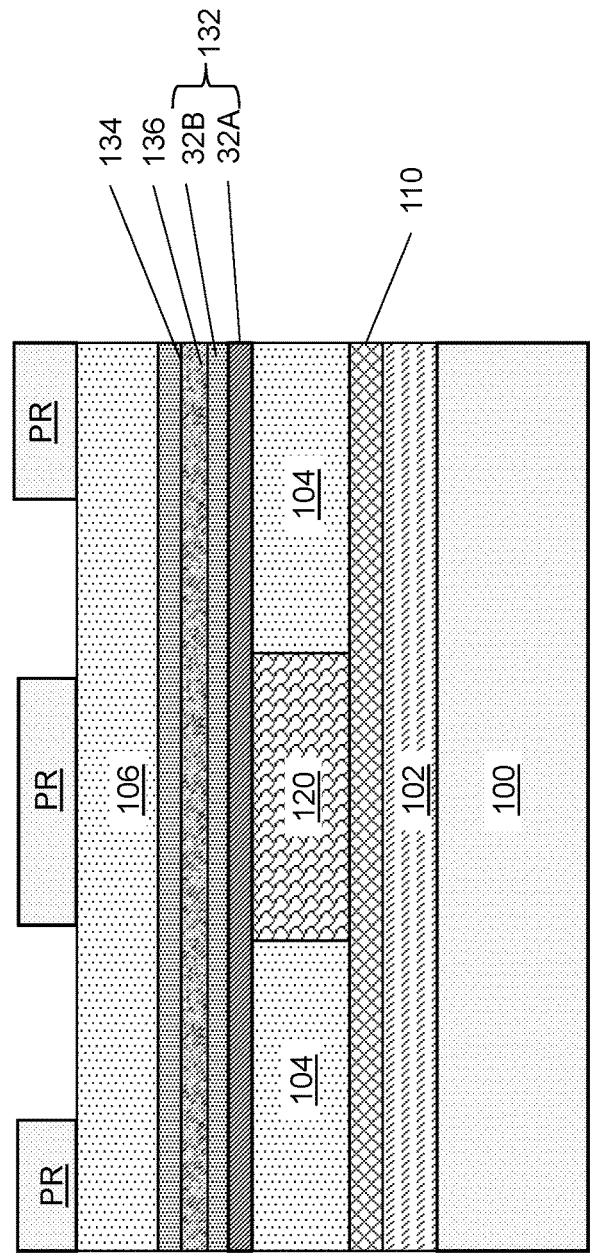

Referring to FIG. 9F, a photoresist material may be deposited on the second dielectric layer 106 and then patterned through photolithographic techniques to form a photoresist pattern PR. The photoresist pattern PR may mask portions of the second dielectric layer 106 while exposing other portions of the second dielectric layer 106.

Figure 9G:
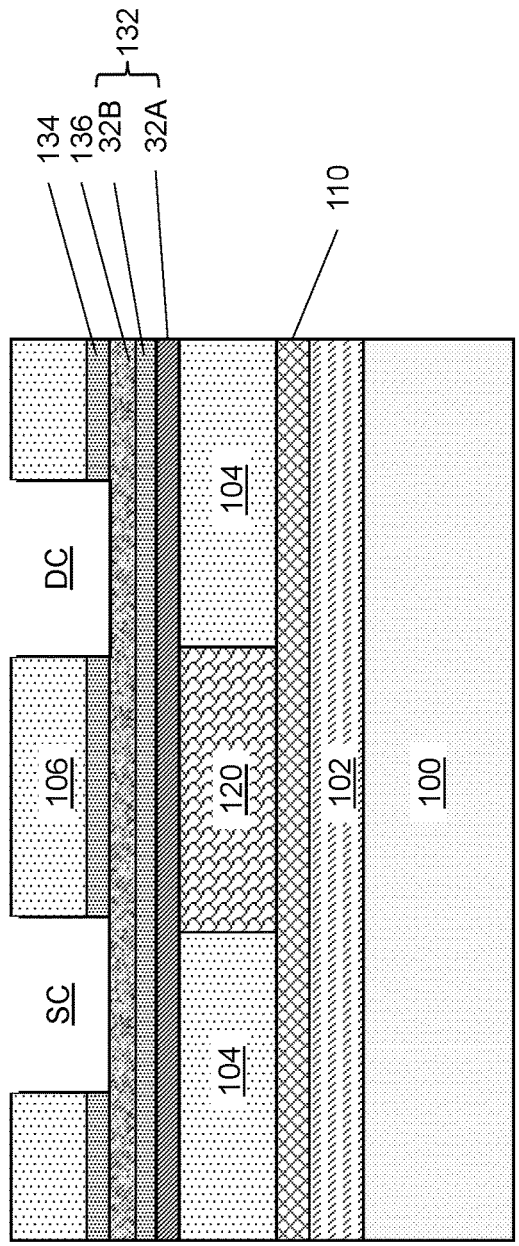

Referring to FIGS. 9F and 9G, an etching process, such as a wet etching or dry etching process, may be performed to form a source cavity SC and a drain cavity DC. The source cavity SC and the drain cavity DC may extend through the second dielectric layer 106 and portions of the capping layer 134 exposed through the photoresist pattern PR and may expose portions of the channel layer 136. The photoresist pattern PR may then be removed, for example, by ashing.

Figure 9H:
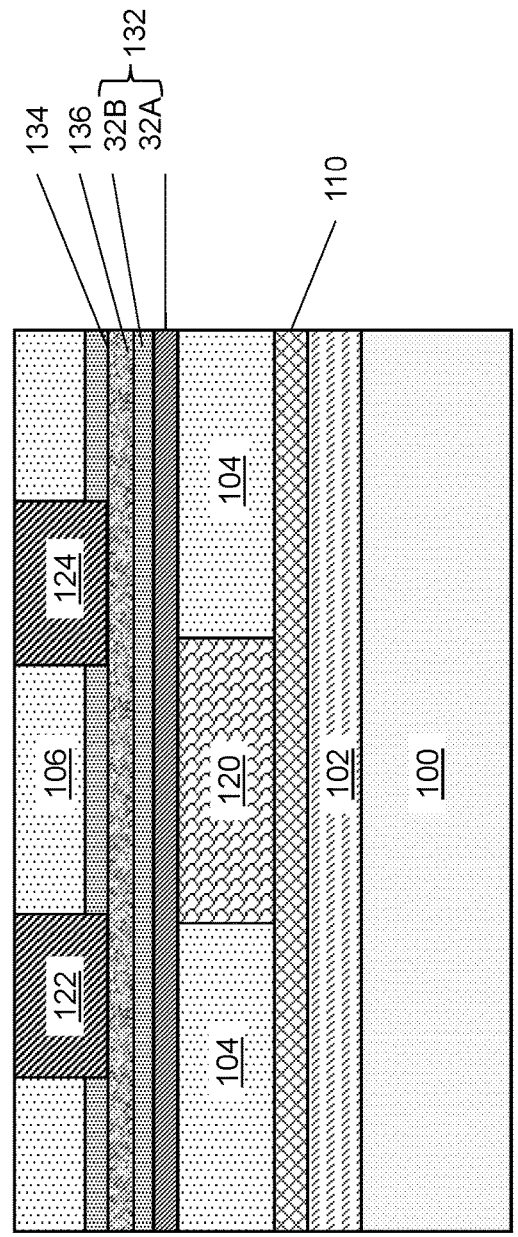

Referring to FIG. 9H, an electrically conductive layer may be deposited on the second dielectric layer 106, so as to form source and drain electrodes 122, 124 in the source and drain cavities SC, DC. A CMP process may then be performed to planarize the second dielectric layer 106 and the source and drain electrodes 122, 124 such that the second dielectric layer 106, source electrode 122 and drain electrode 124 are co-planar. Thus, the top surface of the source electrode 122 and the top surface of the drain electrode 124 may be located within a horizontal plane including the top surface of the second dielectric layer 106. A periphery of the top surface of the source electrode 122 and a periphery of the top surface of the drain electrode 124 may be located entirely within an area of the channel layer 136.

Figure 9I:
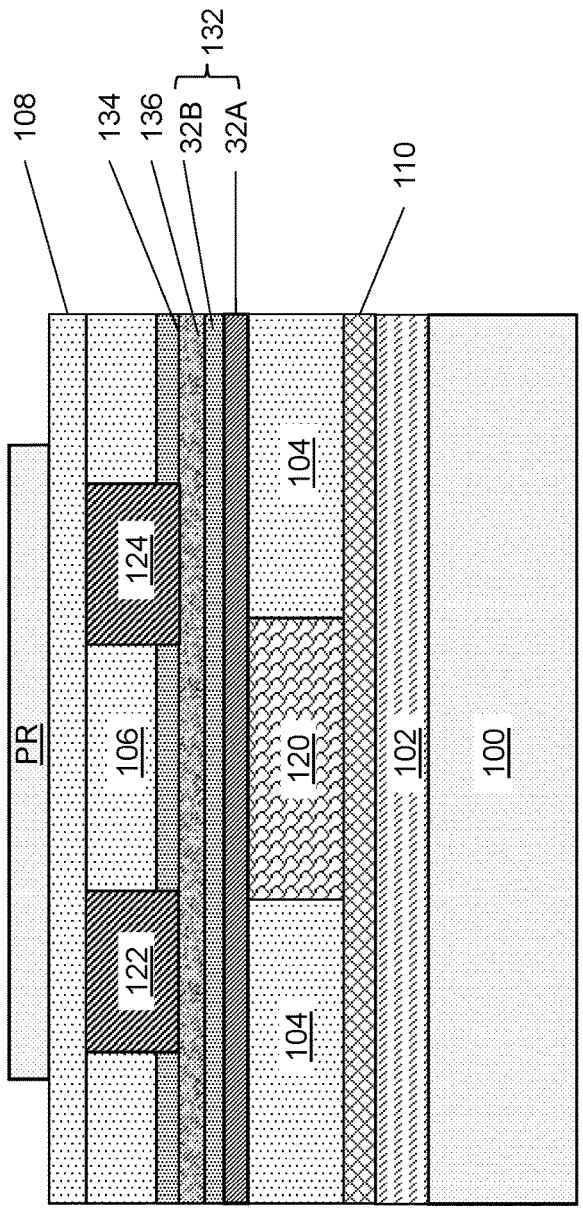

Referring to FIG. 9I, a third dielectric layer 108 may be deposited on the second dielectric layer 106 and the source and drain electrodes 122, 124. A photoresist material may be deposited on the third dielectric layer 108 and then patterned through photolithographic techniques to form a photoresist pattern PR.

Figure 9J:
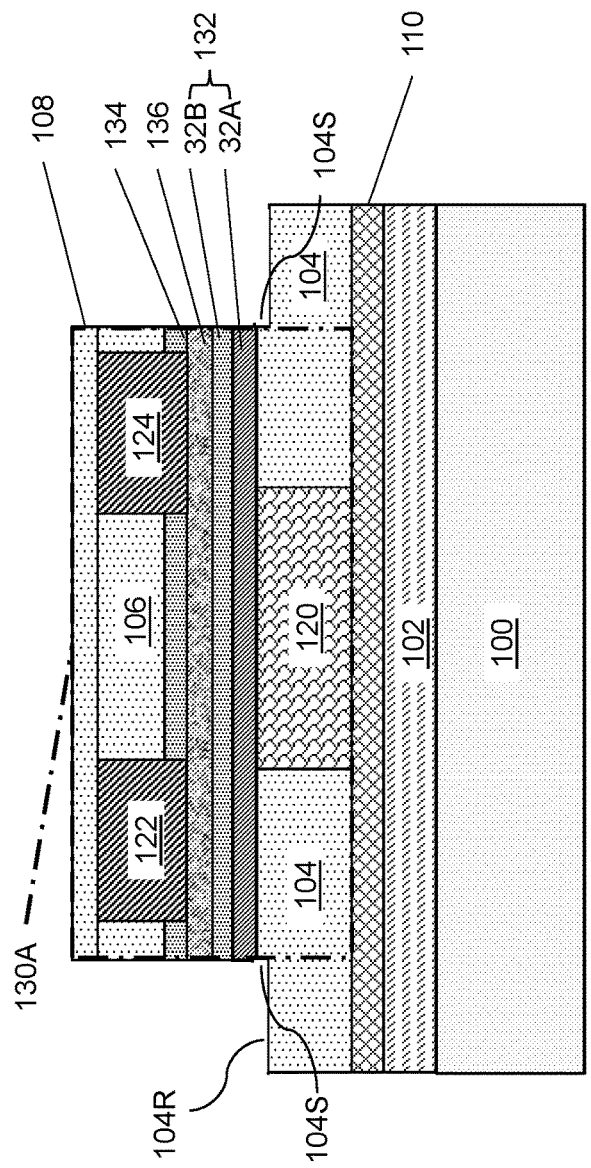

Referring to FIGS. 9I and 9J, an etching process such as a reactive ion etch process may be performed, using the photoresist pattern PR as a mask, in order to etch exposed portions of the third dielectric layer 108 as well as underlying portions of the second dielectric layer 106, the capping layer 134, the channel layer 136 and gate dielectric layer 132. An anisotropic etch process etches the unmasked portions of the third dielectric layer 108, the second dielectric layer 106, the capping layer 134, the channel layer 136, and the gate dielectric layer 132 and vertically recesses unmasked portions of a surface region of the first dielectric layer. A recessed horizontal surface 104R of the first dielectric layer 104 may be physically exposed outside the area of the photoresist pattern PR. In this embodiment, the first dielectric layer 104 comprises a top horizontal surface that contacts the gate dielectric layer 132 and a recessed horizontal surface 104R that does not underlie the gate dielectric layer 132. The recess depth into the first dielectric layer 104 may be in a range from 1 nm to 30 nm, such as from 3 nm to 10 nm, although lesser and greater recess depths may also be used. The recess depth depends on the duration of the final over-etch step during the anisotropic etch process. The area of the photoresist pattern PR defines the area of a thin film transistor 130A.

A set of sidewall segments 104S of the first dielectric layer 104 adjoins the top horizontal surface of the first dielectric layer 104 that contacts the gate dielectric layer 132 to the recessed horizontal surface 104R of the first dielectric layer 104. Generally, sidewalls of the patterned portions of the third dielectric layer 108, the second dielectric layer 106, the capping layer 134, the channel layer 136, the gate dielectric layer 132, and the first dielectric layer 104 may be formed within the same vertical planes. In one embodiment, the photoresist pattern PR may have a rectangular horizontal cross-sectional shape or a horizontal cross-sectional shape of a rounded rectangle, four vertical planes containing sidewalls of the photoresist pattern PR may contain sidewalls of the patterned portions of the third dielectric layer 108, the second dielectric layer 106, the capping layer 134, the channel layer 136, the gate dielectric layer 132, and the first dielectric layer 104. In this embodiment, sidewalls of the patterned portions of the third dielectric layer 108, the second dielectric layer 106, the capping layer 134, the channel layer 136, the gate dielectric layer 132, and the first dielectric layer 104 may be vertically coincident. A first surface and a second surface are vertically coincident if the second surface overlies or underlies the first surface, and the first surface and the second surface are contained within a same vertical plane.

In embodiment, the set of sidewall segments 104S of the first dielectric layer 104 and sidewalls of the patterned portions of the third dielectric layer 108, the second dielectric layer 106, the capping layer 134, the channel layer 136, the gate dielectric layer 132, and the first dielectric layer 104 may be located within a same set of vertical planes. Each vertical plane including a sidewall of the channel layer 136 may contain a sidewall of the third dielectric layer 108, a sidewall of the second dielectric layer 106, a sidewall of the capping layer 134, a sidewall of the gate dielectric layer 132, and a sidewall segments 104S of the first dielectric layer 104 (i.e., a sidewall of a portion of the first dielectric layer 104 that protrudes above the horizontal plane including the recessed horizontal surface 104R of the first dielectric layer 104).

Figure 9K:
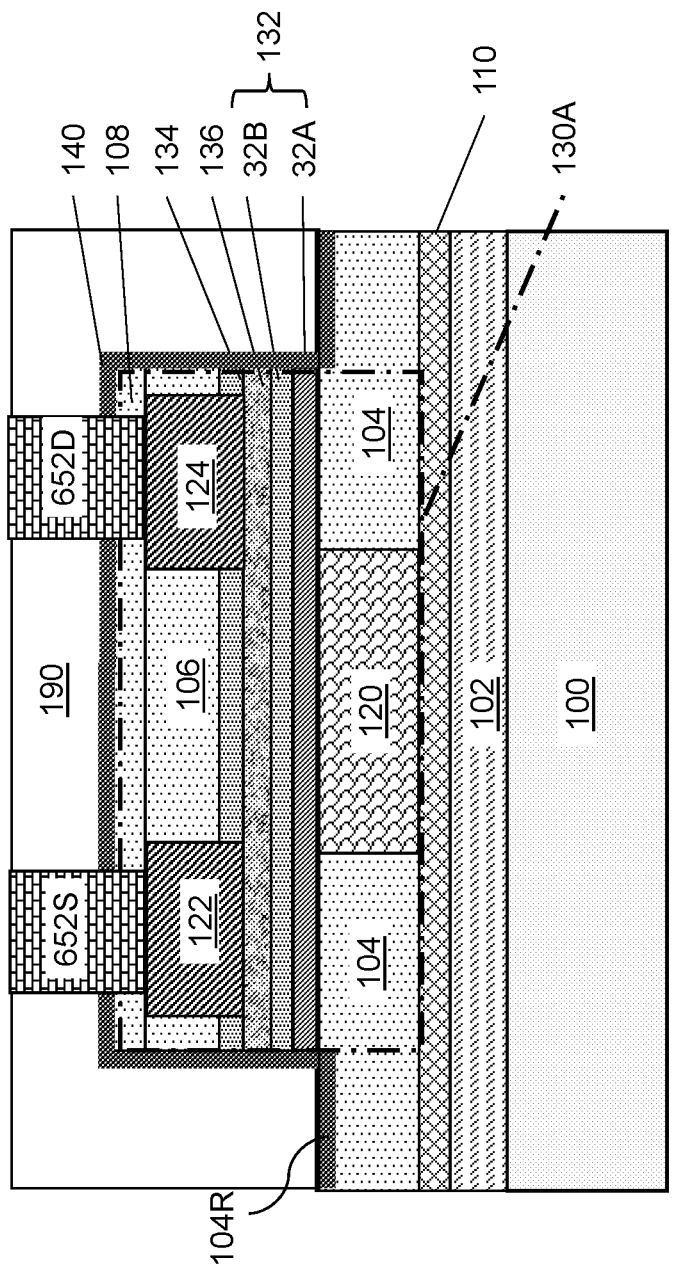

Referring to FIG. 9K, an optional protective layer 140 may be deposited on the physically exposed surfaces to provide device encapsulation. For example, the protective layer 140 may include silicon nitride. In one embodiment, the protective layer 140 may be deposited on the TFT 130, on the sidewalls of the second dielectric layer 106, and on the exposed portion of the first dielectric layer 104, which surrounds the TFT 130A. Subsequently, the TFT-level dielectric layer 190 may be deposited, and various metal interconnect structures including source contact via structures 652S, drain contact via structures 652D, and gate contact via structures 652G may be formed. Each source contact via structure 652S may be formed on a top surface of a respective source electrode 122. Each drain contact via structure 652D may be formed on a top surface of a respective drain electrode 124. Each gate contact via structure 652G (as shown in FIGS. 2B-2D) may be formed on a top surface of a respective gate electrode 120.

Referring again to FIGS. 9C and 9D, in some embodiments the etching of the first dielectric layer 104 may include partially etching the first etch-stop layer 110. Accordingly, the gate channel GC opening may extend into the first etch-stop layer 110. The conductive material deposition and planarization may result in the gate electrode 120 extending into the first etch-stop layer 110, as shown in FIG. 6. In other words, a bottom surface of the gate electrode 120 may be disposed in a channel formed in the first etch-stop layer 110.

Figure 10:
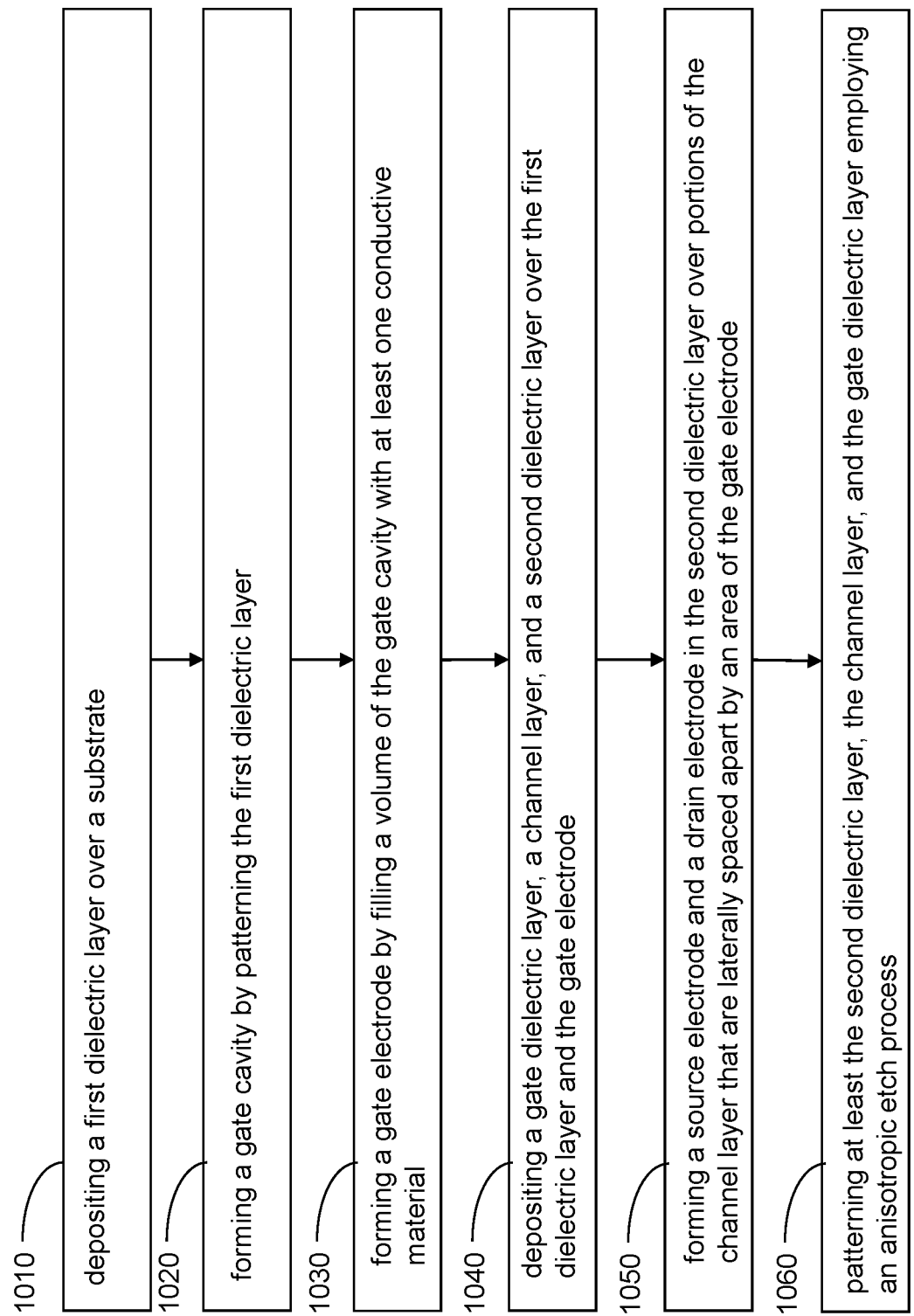
FIG. 10 is a flowchart illustrating a set of processing steps used to form a semiconductor structure according to an embodiment of the present disclosure.

Referring to FIG. 10, a flowchart illustrates a set of processing steps that may be used to form a thin film transistor device of the present disclosure. Referring to step 1010 and FIGS. 1, 8A, and 9A, a first dielectric layer 104 may be deposited over a substrate 100. Referring to step 1020 and FIGS. 8B, 8C, 9B, and 9C, a gate cavity GC may be formed by patterning the first dielectric layer 104. Referring to step 1030 and FIGS. 8D and 9D, a gate electrode 120 may be formed by filling a volume of the gate cavity GC with at least one conductive material. Referring to step 1040 and FIGS. 8E and 9E, a gate dielectric layer 132, a channel layer 136, and a second dielectric layer 106 may be formed over the first dielectric layer 104 and the gate electrode 120. Referring to step 1050 and FIGS. 8F-8H and 9F-9H, a source electrode 122 and a drain electrode 124 may be formed in the second dielectric layer 106 over portions of the channel layer 136 that are laterally spaced apart by an area of the gate electrode 120. Referring to step 1060 and FIGS. 8I-8K and 9I-9K, at least the second dielectric layer 106, the channel layer 136, and the gate dielectric layer 132 may be patterned using an anisotropic etch process. A periphery of a patterned portion of the channel layer 136 comprises a first portion that overlies the first dielectric layer 104 and a second portion that overlies the gate electrode 120.

In one embodiment, the gate electrode 120 may be formed by depositing the at least one conductive material in the gate cavity GC and over a top surface of the first dielectric layer 104, and by removing portions of the at least one conductive material that overlies a horizontal plane including a top surface of the first dielectric layer 104 by performing a chemical mechanical planarization process. A remaining portion of the at least one conductive material that fills the volume of the gate cavity GC constitutes the gate electrode 120.

In one embodiment, the gate cavity GC may be formed by depositing a first photoresist material layer on the first dielectric layer 104, patterning the first photoresist material layer to form a first photoresist pattern, and etching the first dielectric layer using the first photoresist pattern as a mask to form the gate cavity GC. Forming the source electrode 122 and the drain electrode 124 comprises: depositing a second photoresist material layer over the second dielectric layer 106, patterning the second photoresist material layer to form a second photoresist pattern, etching the second dielectric layer using the second photoresist pattern as a mask to form a source cavity SC and a drain cavity DC, and filling the source cavity SC and the drain cavity DC with at least one conductive material to form the source electrode 122 and the drain electrode 124.

Referring to all drawings and according to various embodiments of the present disclosure, a semiconductor structure is provided, which comprises: a first dielectric layer 104 located over a substrate 100; a gate electrode 120 embedded within the first dielectric layer 104; a layer stack comprising a gate dielectric layer 132, a channel layer 136 comprising a semiconducting metal oxide material, and a second dielectric layer 106; and a source electrode 122 and a drain electrode 124 embedded in the second dielectric layer 106 and contacting a respective portion of a top surface of the channel layer 136, wherein a combination of the gate electrode 120, the gate dielectric layer 132, the channel layer 136, the source electrode 122, and the drain electrode 124 comprises a thin film transistor; and a total length of a periphery of a bottom surface of the channel layer 136 that overlies the gate electrode 122 is greater than or equal to a width of the gate electrode 120.

In one embodiment, the gate dielectric layer 132, the channel layer 136, and the second dielectric layer 106 have a set of vertically coincident sidewalls that are contained within a same vertical plane.

In one embodiment, the channel layer 136 comprises a pair of lengthwise sidewalls that laterally extend along a first horizontal direction hd1 and a pair of widthwise sidewalls that laterally extend along a second horizontal direction hd2; and the gate electrode 120 laterally has a pair of gate electrode edges that laterally extend along the second horizontal direction hd2 and are spaced apart from each other by the width of the gate electrode 120.

In one embodiment, a first lengthwise sidewall selected from the pair of lengthwise sidewalls of the channel layer 136 overlaps with the gate electrode 120 in a plan view; a second lengthwise sidewall selected from the pair of lengthwise sidewalls of the channel layer does not overlap with the gate electrode 120 in the plan view; and the total length of the periphery of the bottom surface of the channel layer 136 that overlies the gate electrode 120 is equal to the width of the gate electrode 120 as illustrated in FIGS. 2B and 2D.

In one embodiment, each lengthwise sidewall selected from the pair of lengthwise sidewalls of the channel layer 136 overlaps with the gate electrode 120 in a plan view; and the total length of the periphery of the bottom surface of the channel layer 136 that overlies the gate electrode 120 is equal to twice the width of the gate electrode as illustrated in FIG. 2 C.

In one embodiment, the substrate 100 comprises: a single crystalline semiconductor material layer (as embodied as a semiconductor material layer 9); semiconductor devices located on the single crystalline semiconductor material layer; and at least one dielectric layer (601, 610, 620, 630, 640, 650, 660) embedding metal interconnect structures that are connected to a respective electrical node of the semiconductor devices as illustrated in FIG. 7. In one embodiment, the semiconductor devices comprise field effect transistors 701; and at least one node of the thin film transistor that is selected from the gate electrode 120, the source electrode 122, and the drain electrode 124 is electrically connected to one of the field effect transistors 701 through a subset of the metal interconnect structures.

In one embodiment, the semiconducting metal oxide comprises a material selected from indium gallium zinc oxide (IGZO), indium tungsten oxide, indium zinc oxide, indium tin oxide, gallium oxide, indium oxide, doped zinc oxide, doped indium oxide, doped cadmium oxide.

According to another aspect of the present disclosure, a transistor device is provided, which comprises: an etch-stop layer (110 and/or 112) disposed on a substrate 100; a first dielectric layer 104 disposed on the etch-stop layer (110 and/or 112) and embedding a gate electrode 120 therein, the gate electrode 120 having a top surface that is co-planar with a top surface of the first dielectric layer 104; a gate dielectric layer 132 overlying the first dielectric layer 104 and the gate electrode 120; a channel layer 136 comprising a semiconducting metal oxide material and located on the gate dielectric layer 132; and a second dielectric layer 106 embedding a source electrode 122 and a drain electrode 124 and overlying the channel layer 136, wherein the source electrode 122 and the drain electrode 124 contact a respective portion of a top surface of the channel layer 136, wherein a periphery of a top surface of the gate dielectric layer 132 coincides with a periphery of a bottom surface of the channel layer 136, and a periphery of a bottom surface of the channel layer 136 coincides with a periphery of a top surface of the first dielectric layer 104.

In one embodiment, the channel layer 136 comprises a pair of lengthwise sidewalls that laterally extend along a first horizontal direction hd1 and a pair of widthwise sidewalls that laterally extend along a second horizontal direction hd2; and an entire area of the gate electrode 120 does not overlap with any portion of the pair of widthwise sidewalls of the channel layer 136 in a plan view.

In one embodiment, each sidewall of the channel layer 136 is vertically coincident with a respective sidewall of the second dielectric layer 106. In one embodiment, a top surface of the source electrode 122 and a top surface of the drain electrode 124 are located within a horizontal plane including a top surface of the second dielectric layer 106.

In one embodiment, the first dielectric layer 104 comprises a top horizontal surface that contacts the gate dielectric layer 136 and a recessed horizontal surface 104R that does not underlie the gate dielectric layer 136; a set of sidewall segments 104S of the first dielectric layer 104 adjoins the top horizontal surface of the first dielectric layer 104 to the recessed horizontal surface 104R of the first dielectric layer 104; and the set of sidewall segments 104S of the first dielectric layer 104 and sidewalls of the channel layer 136 are located within a same set of vertical planes.

Various embodiments of the present disclosure provide a transistor device comprising: a first dielectric layer 104 comprising a gate cavity GC; a gate electrode 120 disposed in the gate cavity GC, the gate electrode 120 having a top surface that is co-planar with a top surface of the first dielectric layer 104; a gate dielectric layer 132 disposed on the first dielectric layer 104 and the gate electrode 120; a channel layer 136 disposed on the gate dielectric layer 132; a second dielectric layer 106 disposed over the channel layer 136 and comprising a source cavity SC and a drain cavity DC that expose respective portions of the channel layer 136; and source and drain electrodes 122, 124 respectively disposed in the source and drain cavities SC, DC and having top surfaces that are co-planar with a top surface of the second dielectric layer 106.

Various embodiments of the present disclosure provide a transistor device comprising: an etch-stop layer 110 disposed on a substrate 100; a first dielectric layer 104 disposed on the etch-stop layer 110 and comprising a gate cavity GC; a gate electrode 120 disposed in the gate cavity GC, the gate electrode 120 having a top surface that is co-planar with a top surface of the first dielectric layer 104; a first gate dielectric layer 32A covering the first dielectric layer 104 and the gate electrode 120; a second gate dielectric layer 32B covering the first gate dielectric layer 32A; a channel layer 136 disposed on the second gate dielectric layer 32B; a second dielectric layer 106 comprising source and drain cavities SC, DC that expose respective portions of the channel layer 136; source and drain electrodes 122, 124 respectively disposed in the source and drain cavities SC, DC and having top surfaces that are co-planar with a top surface of the second dielectric layer 106; and a third dielectric layer 108 covering the second dielectric layer 106 and the source and drain electrodes 122, 124.

Various embodiments of the present disclosure provide a method of forming a transistor device, the method comprising: depositing a first etch-stop layer 110 over a substrate 100; depositing a first dielectric layer 104 on the first etch-stop layer 110; patterning the first dielectric layer 104 to form a gate cavity GC; depositing a gate electrode 120 in the gate cavity GC; planarizing the gate electrode 120 and first dielectric layer 104 to form a co-planar surface between the gate electrode 120 and first dielectric layer 104; depositing a gate dielectric layer 132 on the gate electrode 120 and the first dielectric layer 104; depositing a channel layer 136 over the gate dielectric layer 132; depositing a second dielectric layer 106 on the channel layer 136; patterning the second dielectric layer 106 to form source and drain cavities SC, DC in the second dielectric layer 106; depositing source and drain electrodes 122, 124 respectively in the source and drain cavities SC, DC; depositing a third dielectric layer 108 on the source and drain electrodes 122, 124 and the second dielectric layer 106; and defining the thin film transistor device (10, 20, 30, 40, 50) by etching the third dielectric layer 108 to expose a portion of the first dielectric layer 104.

The TFT semiconductor device (10, 20, 30, 40, 50) of the present disclosure does not use any global bottom gate electrode that underlies an entire area of a channel layer 136. The area of a gate electrode 120 is less than the area of the channel layer 136 in the TFT semiconductor device (10, 20, 30, 40, 50) of the present disclosure. The periphery of the second dielectric layer 106 that overlies the gate electrode 120 has a total length that is equal to the width of the gate electrode 120 along the first horizontal direction hd1 (as shown in the configuration of FIGS. 2A and 2D) or has a total length that is equal to twice the width of the gate electrode 120 along the first horizontal direction hd1 (as shown in the configuration of FIG. 2C). Thus, the gate material re-sputtering region GMRR has a small area, and the probability of electrical shorts (i.e., unintended electrical coupling) caused by re-sputtering of the conductive material of the gate electrode 120 during patterning of the second dielectric layer 106 may be minimized. As a result, a current leakage path may occur between the global bottom gate electrode and source/drain region electrodes, due to reduction of the re-deposition of conductive materials during etching of the second dielectric layer 106 and the channel layer 136.

According to various embodiments, TFT semiconductor devices 10, 20, 30, 40, 50 are provided that include patterned bottom gate electrodes 120 that operate to prevent the occurrence of current leakage due to re-deposition. The patterned bottom gate electrode 120 are embedded in a first dielectric layer 104, and a top surface of the patterned bottom gate electrode 120 is co-planar with a top surface of the first dielectric layer 104.

The gate electrode 120 may laterally extend along the second horizontal direction hd2 with a uniform width along the first horizontal direction hd1. The total length of the periphery of the patterned portion of the channel layer 136 that overlies the gate electrode 120 may be equal to the width of the gate electrode 120 (along the first horizontal direction hd1) or twice the width of the gate electrode 120.

According to various embodiments, a first dielectric layer 104 having gate cavities GC patterned to define position and dimension of bottom gate electrodes 120 of TFT semiconductor device 10, 20, 30, 40, 50 may be formed. A conductive material may be deposited on the first dielectric layer 104 to fill the gate cavities GC. Then, the resultant structure is planarized to remove the conductive material from the top surface of the first dielectric layer 104 and planarize the bottom gate electrodes 120.

According to various embodiments, the dimensions and locations of patterned bottom gate electrodes 120 of TFT semiconductor device 10, 20, 30, 40, 50 may be precisely controlled. Further, the overlay of bottom gate electrodes 120 and source/drain electrodes 122, 124 may be easily controlled. Sidewall re-deposition of metallic material may be prevented when etching layers of $AlO_x/IGZO/AlO_x$, because the bottom gate electrodes 120 may be entirely covered by the $AlO_x/IGZO/AlO_x$ layers. Splashing of the bottom gate electrodes 120 may be prevented because the bottom gate electrodes 120 may be entirely covered and protected by $AlO_x/IGZO/AlO_x$ layers.

The various embodiments of the present disclosure may be used to reduce the area of gate material re-sputtering region GMRR in which physically exposed surfaces of the gate electrode 120 is proximal to sidewalls of the channel layer 136 including a semiconducting metal oxide material. Because the electrical conductivity of the semiconducting metal oxide material is very low, even a small amount of re-deposition of a metallic material from the gate electrode 120 may result in detrimental electrical shorts. The periphery of the bottom surface of the channel region 136 that traverses the area of the gate electrode is minimized by patterning the gate electrode 120 of the thin film transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a first dielectric layer;
   a gate electrode embedded in the first dielectric layer;
   a gate dielectric layer;
   a channel layer disposed on the gate dielectric layer and comprising a semiconducting metal oxide material; and
   a source electrode and a drain electrode contacting a top surface of the channel layer,
   wherein:
   the first dielectric layer comprises a top horizontal surface that contacts the gate dielectric layer and a recessed horizontal surface that does not underlie the gate dielectric layer; and
   a set of sidewall segments of the first dielectric layer adjoins the top horizontal surface of the first dielectric layer to the recessed horizontal surface of the first dielectric layer.

2. The semiconductor structure of claim 1, further comprising a second dielectric layer covering the source electrode and the drain electrode.

3. The semiconductor structure of claim 2, wherein the gate dielectric layer, the channel layer, and the second dielectric layer have a set of vertically coincident sidewalls that are contained within a same vertical plane.

4. The semiconductor structure of claim 1, wherein:
   the channel layer comprises a pair of lengthwise sidewalls that laterally extend along a first horizontal direction and a pair of widthwise sidewalls that laterally extend along a second horizontal direction; and
   the gate electrode has a pair of gate electrode edges that laterally extend along the second horizontal direction and that are spaced apart from each other by the width of the gate electrode.

5. The semiconductor structure of claim 4, wherein:
   a first lengthwise sidewall selected from the pair of lengthwise sidewalls of the channel layer overlaps with the gate electrode in a plan view;
   a second lengthwise sidewall selected from the pair of lengthwise sidewalls of the channel layer does not overlap with the gate electrode in the plan view; and
   the total length of the periphery of the bottom surface of the channel layer that overlies the gate electrode is equal to the width of the gate electrode.

6. The semiconductor structure of claim 4, wherein:
   each lengthwise sidewall selected from the pair of lengthwise sidewalls of the channel layer overlaps with the gate electrode in a plan view; and
   the total length of the periphery of the bottom surface of the channel layer that overlies the gate electrode is equal to twice the width of the gate electrode.

7. The semiconductor structure of claim 1, wherein the first dielectric layer is disposed on a lower level device structure comprising:
   a single crystalline semiconductor material layer;
   semiconductor devices located on the single crystalline semiconductor material layer; and
   at least one dielectric layer embedding metal interconnect structures that are connected to a respective electrical node of the semiconductor devices.

8. The semiconductor structure of claim 7, wherein:
   the semiconductor devices comprise field effect transistors; and
   at least one node of the transistor that is selected from the gate electrode, the source electrode, and the drain electrode is electrically connected to one of the field effect transistors through a subset of the metal interconnect structures.

9. The semiconductor structure of claim 1, wherein the set of sidewall segments of the first dielectric layer and sidewalls of the channel layer are located within a same set of vertical planes.

10. The semiconductor structure of claim 1, further comprising a first etch-stop layer located between the substrate and the first dielectric layer, wherein a bottom surface of the gate electrode contacts a surface of the first etch-stop layer which is a topmost surface or a recessed surface of the first etch-stop layer.

11. The semiconductor structure of claim 1, wherein:
a top surface of the source electrode and a top surface of the drain electrode are located within a horizontal plane including a top surface of the second dielectric layer; and
a periphery of the top surface of the source electrode and a periphery of the top surface of the drain electrode are located entirely within an area of the channel layer.

12. The semiconductor structure of claim 1, wherein the semiconducting metal oxide comprises a material selected from indium gallium zinc oxide (IGZO), indium tungsten oxide, indium zinc oxide, indium tin oxide, gallium oxide, indium oxide, doped zinc oxide, doped indium oxide, doped cadmium oxide.

13. A transistor device comprising:
a first dielectric layer;
a gate electrode embedded within the first dielectric layer;
a gate dielectric layer disposed on the gate dielectric layer and the gate electrode;
a channel layer disposed on the gate dielectric layer and comprising a semiconducting metal oxide material; and
a source electrode and a drain electrode disposed on the channel layer,
wherein a periphery of a top surface of the gate dielectric layer coincides with a periphery of a bottom surface of the channel layer, and a periphery of a bottom surface of the channel layer coincides with a periphery of a top surface of the first dielectric layer.

14. The transistor device of claim 13, wherein:
the channel layer comprises a pair of lengthwise sidewalls that laterally extend along a first horizontal direction and a pair of widthwise sidewalls that laterally extend along a second horizontal direction; and
an entire area of the gate electrode does not overlap with any portion of the pair of widthwise sidewalls of the channel layer in a plan view.

15. The transistor device of claim 13, wherein each sidewall of the channel layer is vertically coincident with a respective sidewall of the second dielectric layer.

16. The transistor device of claim 13, wherein a top surface of the source electrode and a top surface of the drain electrode are located within a horizontal plane including a top surface of the second dielectric layer.

17. The transistor device of claim 13, wherein:
the first dielectric layer comprises a top horizontal surface that contacts the gate dielectric layer and a recessed horizontal surface that does not underlie the gate dielectric layer;
a set of sidewall segments of the first dielectric layer adjoins the top horizontal surface of the first dielectric layer to the recessed horizontal surface of the first dielectric layer; and
the set of sidewall segments of the first dielectric layer and sidewalls of the channel layer are located within a same set of vertical planes.

18. A method of forming a transistor device, the method comprising:
forming a gate electrode in a gate cavity of a first dielectric layer;
depositing a gate dielectric layer, a channel layer, and a second dielectric layer over the first dielectric layer and the gate electrode;
forming a source electrode and a drain electrode in the second dielectric layer over portions of the channel layer; and
patterning at least the second dielectric layer, the channel layer, and the gate dielectric layer using an anisotropic etch process, such that a periphery of a patterned portion of the channel layer comprises a first portion that overlies the first dielectric layer and a second portion that overlies the gate electrode.

19. The method of claim 18, wherein forming the gate electrode comprises:
depositing the at least one conductive material in the gate cavity and over a top surface of the first dielectric layer; and
removing portions of the at least one conductive material that overlies a horizontal plane including a top surface of the first dielectric layer by performing a chemical mechanical planarization process, wherein a remaining portion of the at least one conductive material that fills the volume of the gate cavity constitutes the gate electrode.

20. The method of claim 18, further comprising:
depositing a first photoresist material layer on the first dielectric layer;
patterning the first photoresist material layer to form a first photoresist pattern; and
etching the first dielectric layer using the first photoresist pattern as a mask to form the gate cavity.

* * * * *